(12) United States Patent
Mitsugi et al.

(10) Patent No.: US 12,181,513 B2
(45) Date of Patent: Dec. 31, 2024

(54) INSPECTION METHOD

(71) Applicant: Hitachi High-Tech Corporation, Tokyo (JP)

(72) Inventors: Shota Mitsugi, Tokyo (JP); Yohei Nakamura, Tokyo (JP); Daisuke Bizen, Tokyo (JP); Junichi Fuse, Tokyo (JP); Satoshi Takada, Tokyo (JP); Natsuki Tsuno, Tokyo (JP)

(73) Assignee: Hitachi High-Tech Corporation, Tokyo (JP)

( * ) Notice: Subject to any disclaimer, the term of this patent is extended or adjusted under 35 U.S.C. 154(b) by 119 days.

(21) Appl. No.: 18/026,718

(22) PCT Filed: Sep. 30, 2020

(86) PCT No.: PCT/JP2020/037156
§ 371 (c)(1),
(2) Date: Mar. 16, 2023

(87) PCT Pub. No.: WO2022/070308
PCT Pub. Date: Apr. 7, 2022

(65) Prior Publication Data
US 2023/0273254 A1    Aug. 31, 2023

(51) Int. Cl.
*G01R 31/26* (2020.01)
*G01R 31/265* (2006.01)

(52) U.S. Cl.
CPC ..... *G01R 31/2653* (2013.01); *G01R 31/2656* (2013.01)

(58) Field of Classification Search
CPC ............ G01R 31/2653; G01R 31/2884; G01R 31/305; G01R 31/307; G01R 31/311; G01R 31/66
See application file for complete search history.

(56) References Cited

U.S. PATENT DOCUMENTS 6,335,532 B1 * 1/2002 Tanaka .................... H01J 37/21
250/397
2001/0016938 A1   8/2001 Nishiyama et al.
(Continued)

FOREIGN PATENT DOCUMENTS

JP    2001-313322 A    11/2001
JP    2003-22946 A     1/2003
(Continued)

OTHER PUBLICATIONS

International Search Report (PCT/ISA/210) issued in PCT Application No. PCT/JP2020/037156 dated Dec. 15, 2020 with English translation (six (6) pages).
(Continued)

*Primary Examiner* — Tung X Nguyen
(74) *Attorney, Agent, or Firm* — Crowell & Moring LLP

(57) ABSTRACT

A control device controls a contact probe in synchronization with a pulse-controlled light having a predetermined wavelength, a measurement instrument measures a characteristic of a sample to be inspected or an analysis sample, and a circuit constant or a defect structure of the sample to be inspected is estimated based on a circuit model created by an electric characteristic analysis device configured to generate the circuit model based on a value measured by the measurement instrument and a detection signal of secondary electrons detected by the charged particle beam device.

12 Claims, 16 Drawing Sheets

(56) References Cited

U.S. PATENT DOCUMENTS

| | | | |
|---|---|---|---|
| 2003/0094572 A1 | 5/2003 | Matsui et al. | |
| 2005/0236648 A1* | 10/2005 | Nishiyama | G01R 31/307 |
| | | | 257/200 |
| 2006/0060781 A1* | 3/2006 | Watanabe | B82Y 40/00 |
| | | | 250/310 |
| 2019/0244783 A1 | 8/2019 | Ohashi et al. | |

FOREIGN PATENT DOCUMENTS

| | | |
|---|---|---|
| JP | 2003-151483 A | 5/2003 |
| JP | 2008-130582 A | 6/2008 |
| JP | 2011-14798 A | 1/2011 |
| JP | 2011-43346 A | 3/2011 |
| JP | 2013-187510 A | 9/2013 |
| JP | 2019-139912 A | 8/2019 |

OTHER PUBLICATIONS

Japanese-language Written Opinion (PCT/ISA/237) issued in PCT Application No. PCT/JP2020/037156 dated Dec. 15, 2020 (five (5) pages).

\* cited by examiner

[FIG. 5]
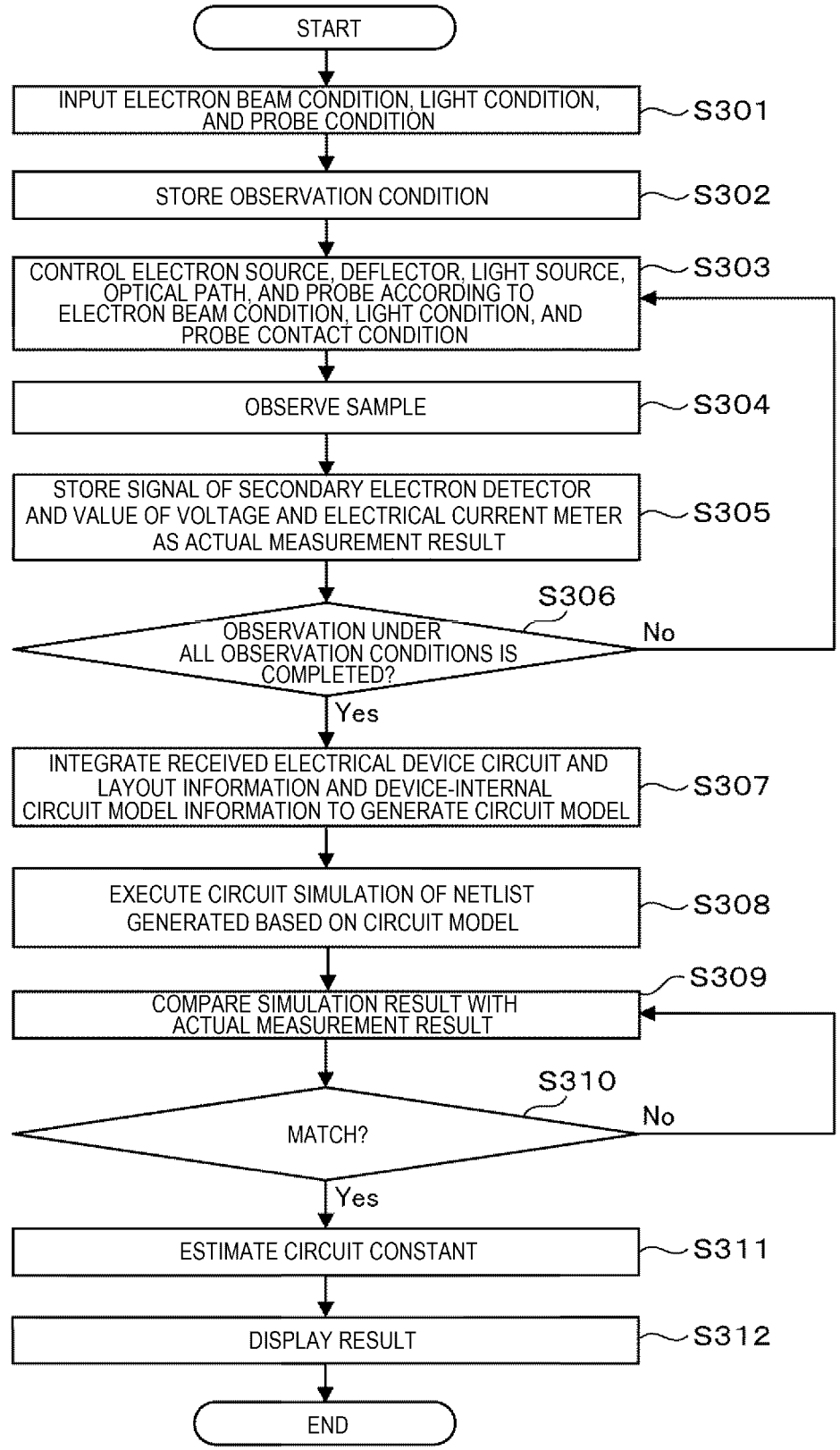

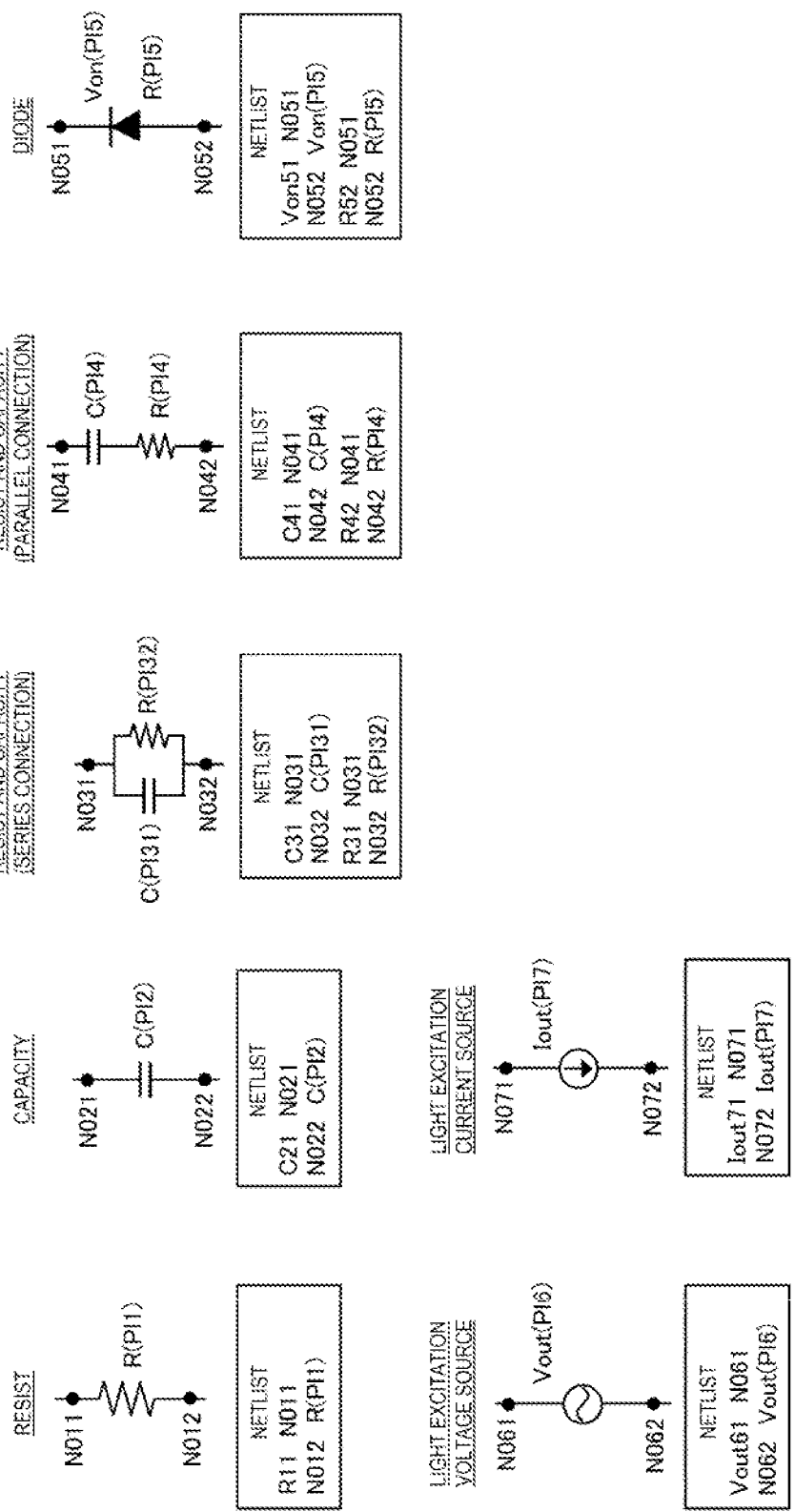

[FIG. 8]
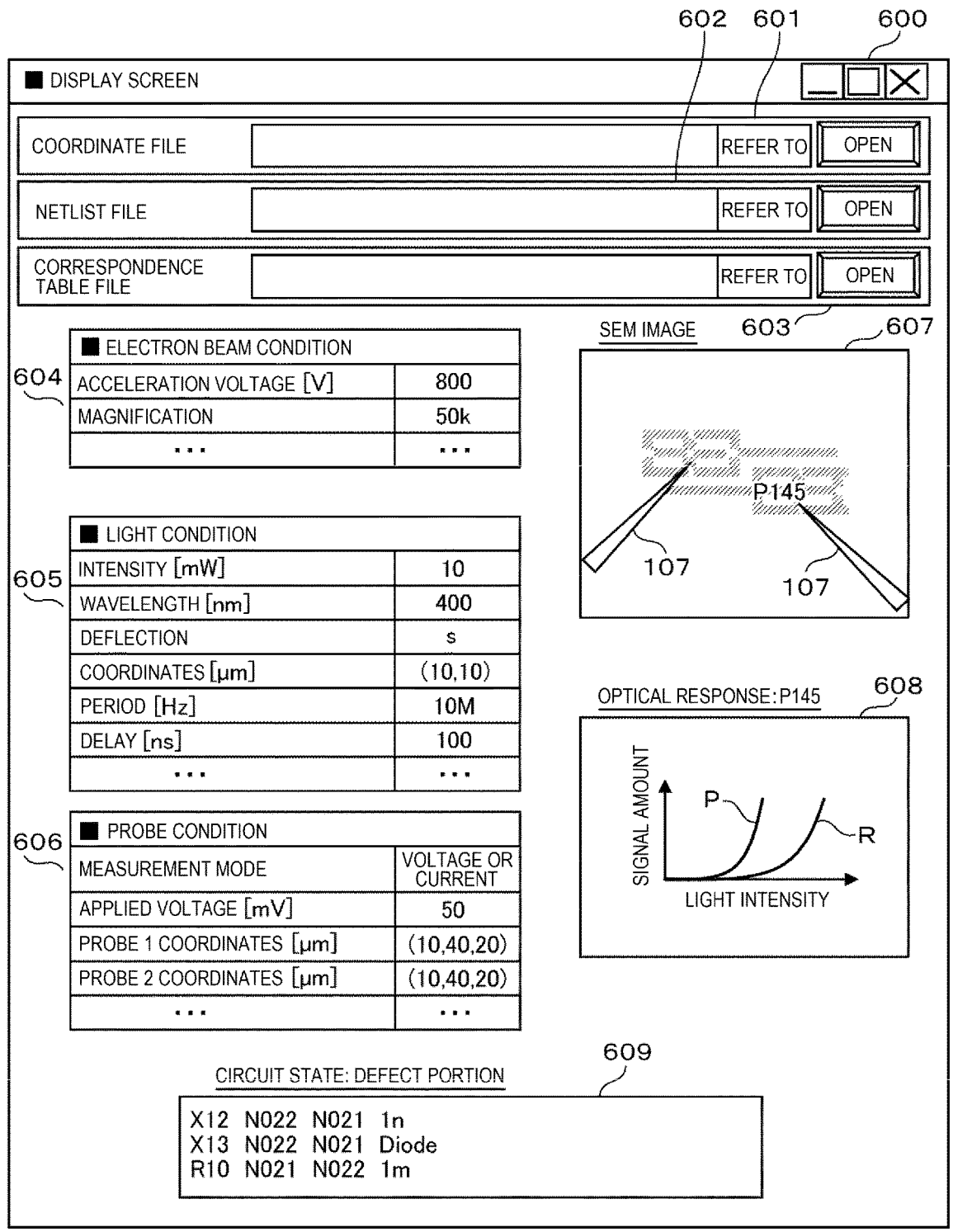

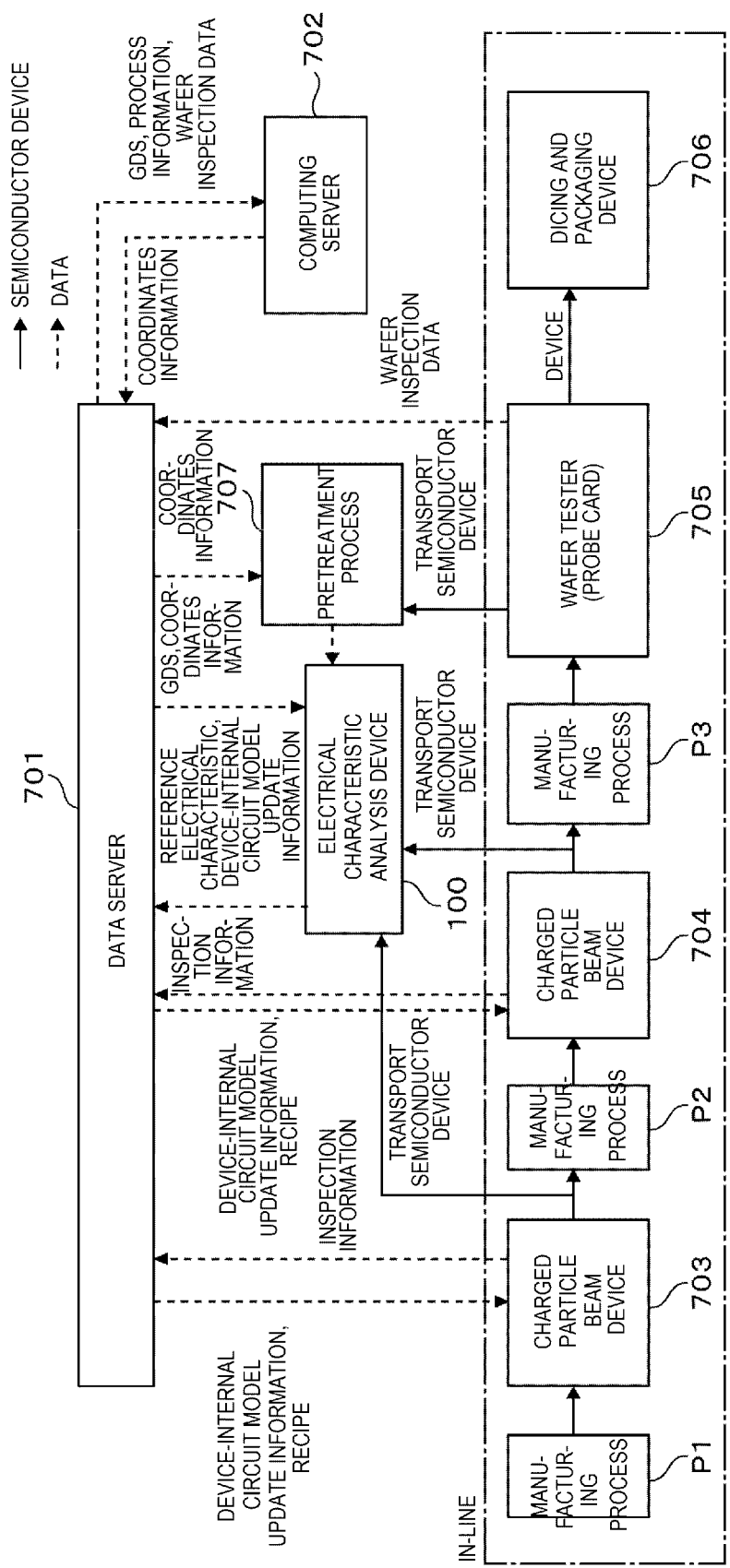
[FIG. 9]

[FIG. 10]
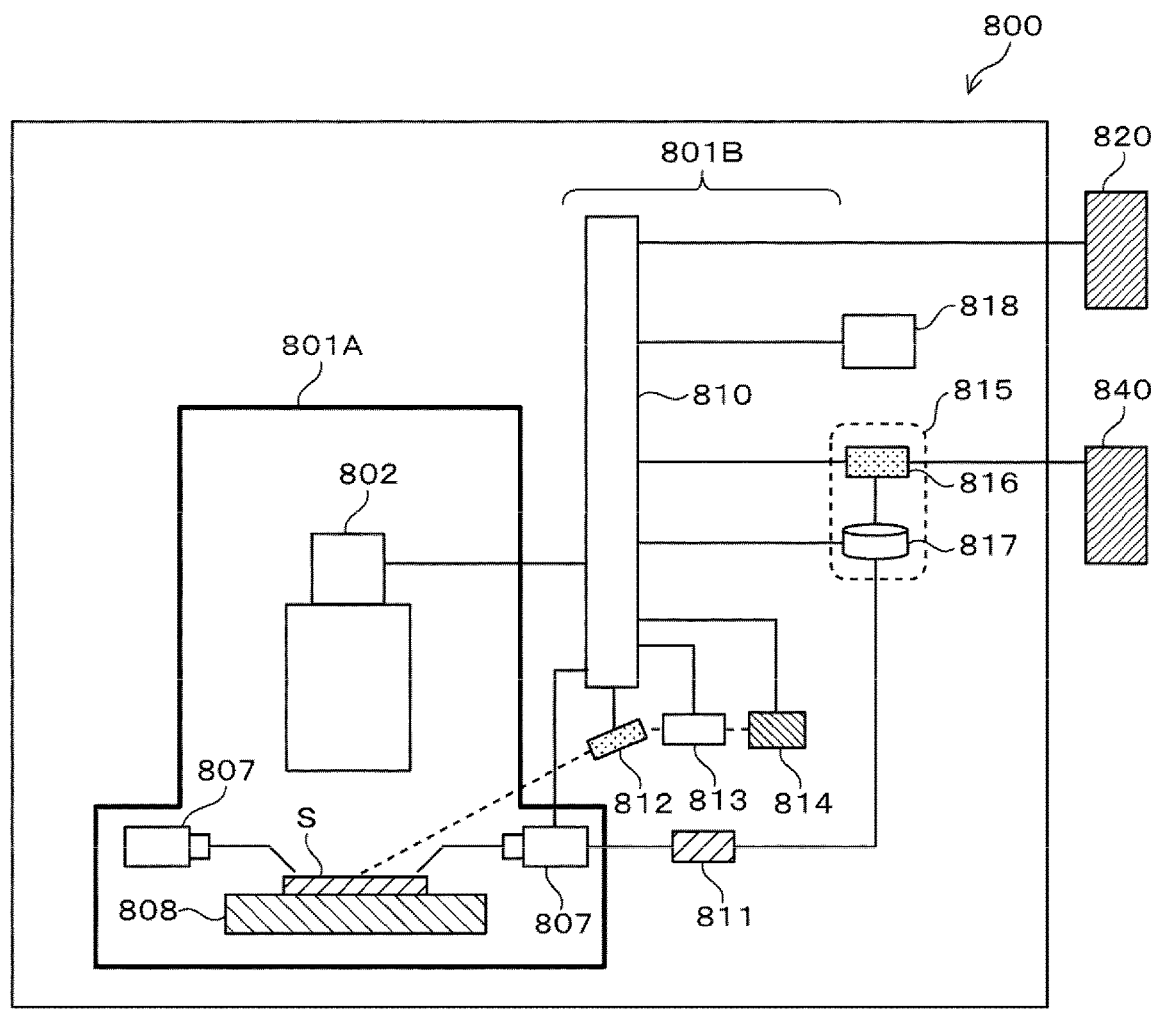

FIG. 11A
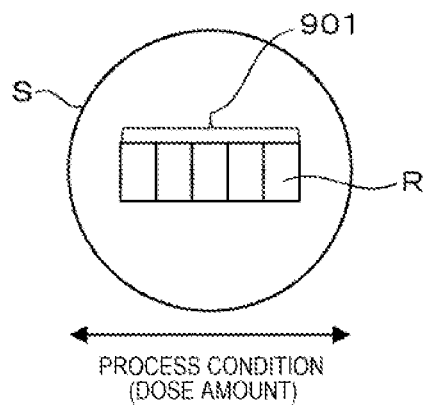
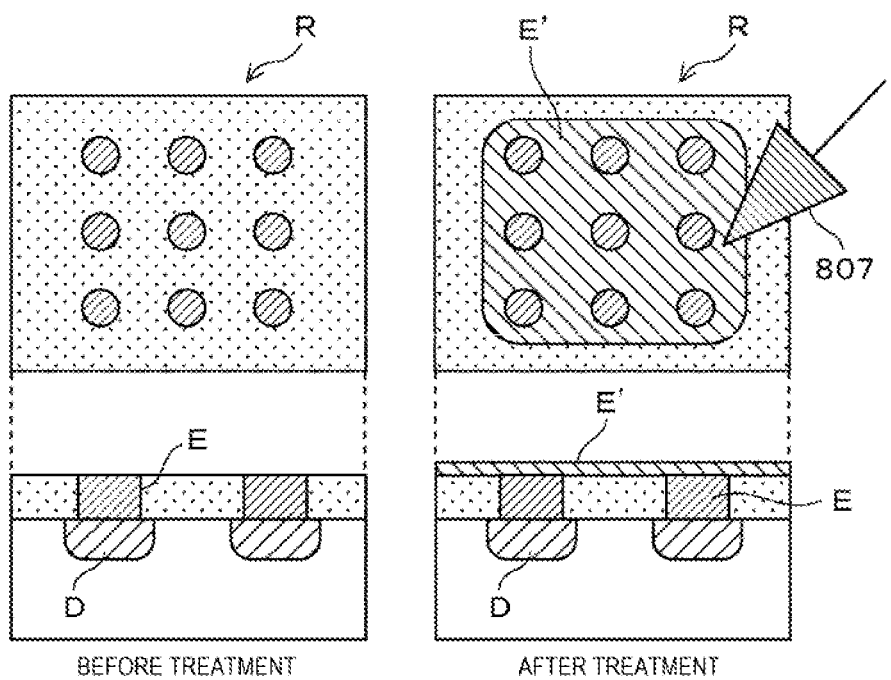
FIG. 11B

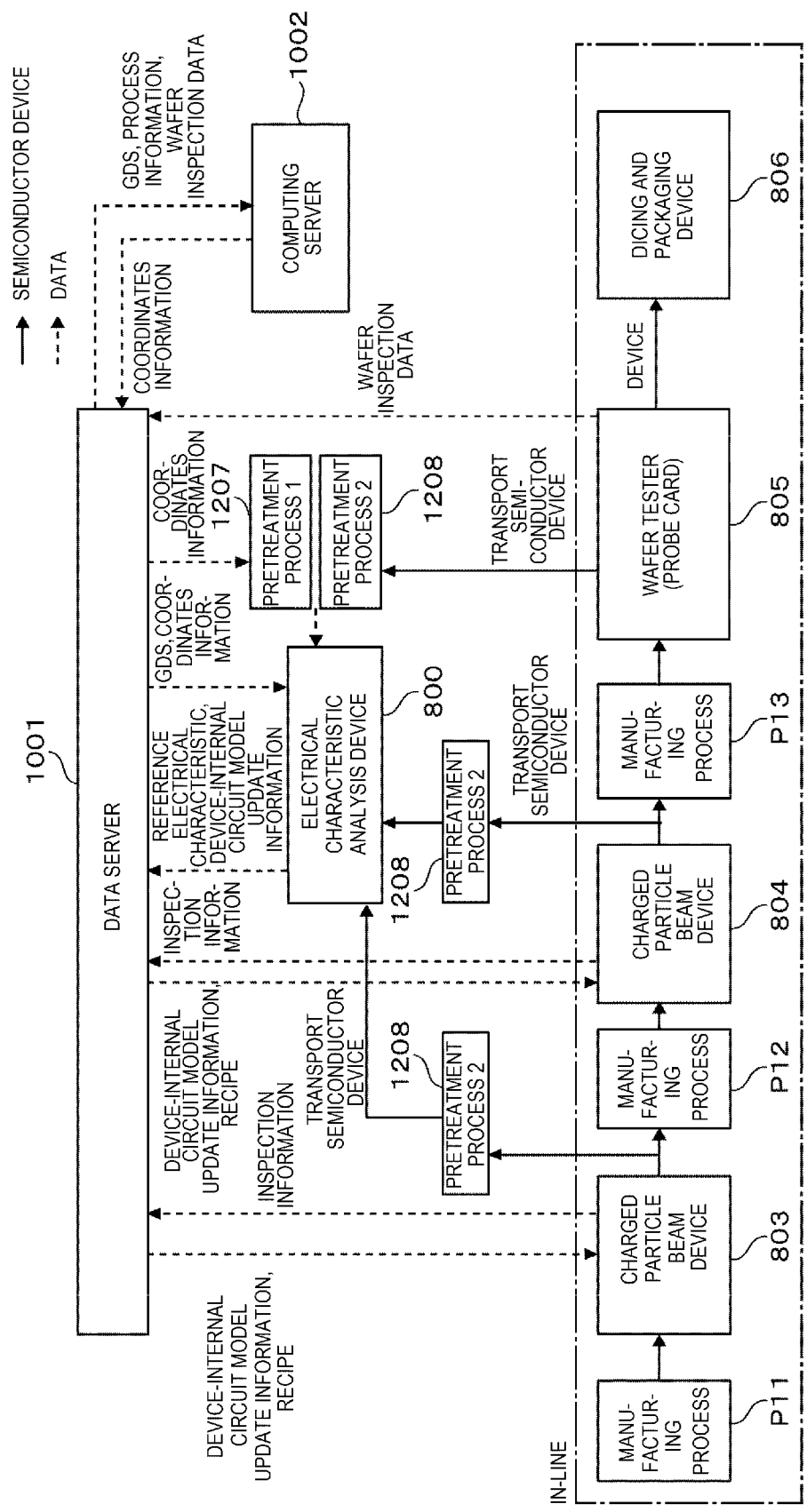
[FIG. 12]

[FIG. 13]
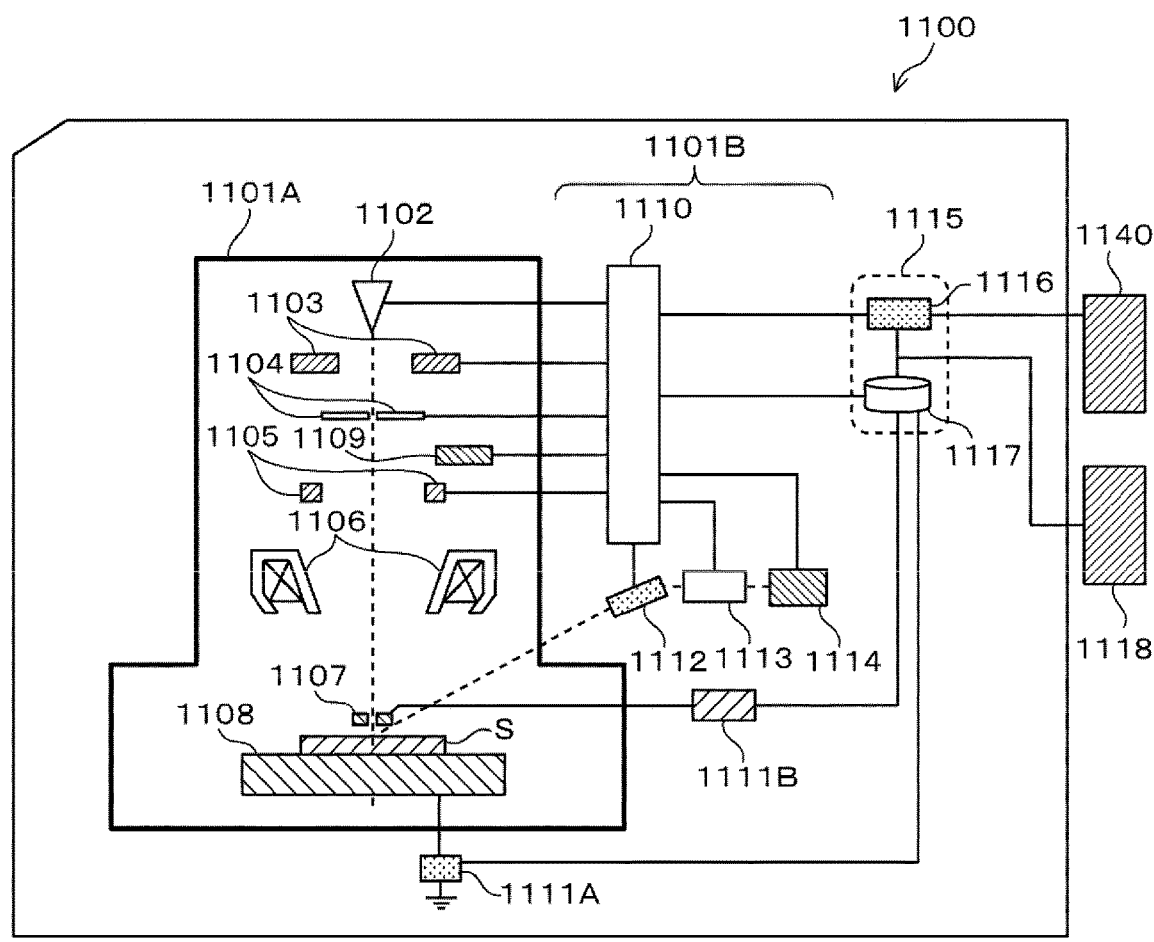

[FIG. 14]
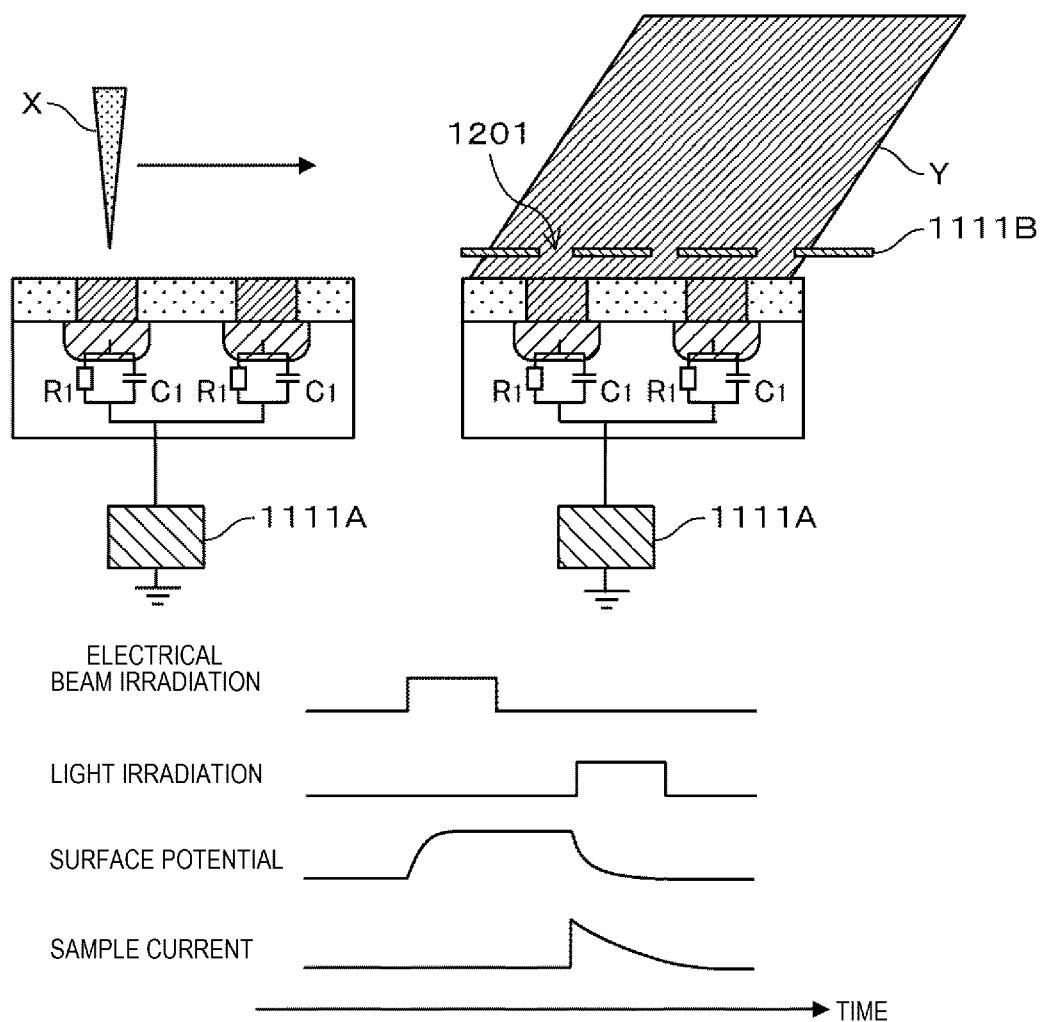

[FIG. 15]
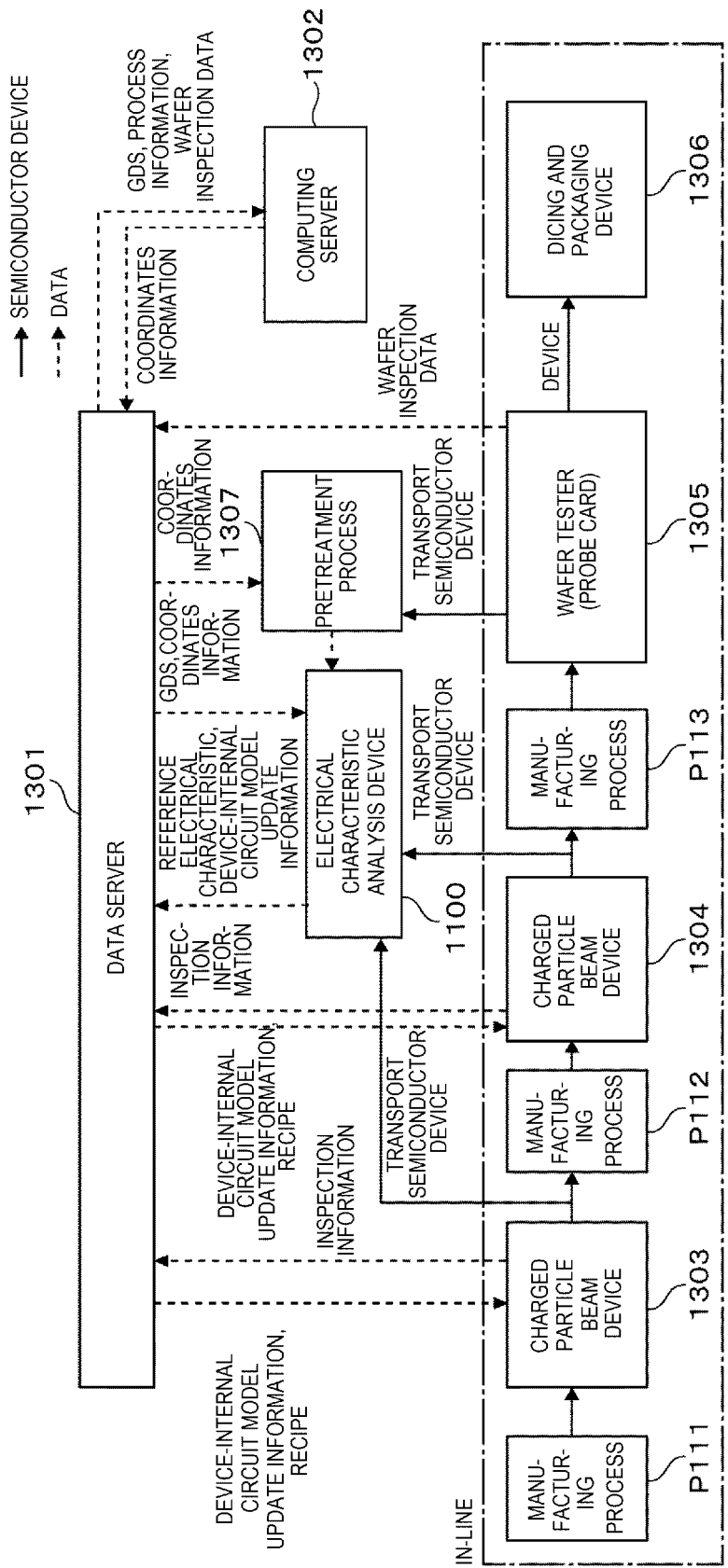

[FIG. 16]
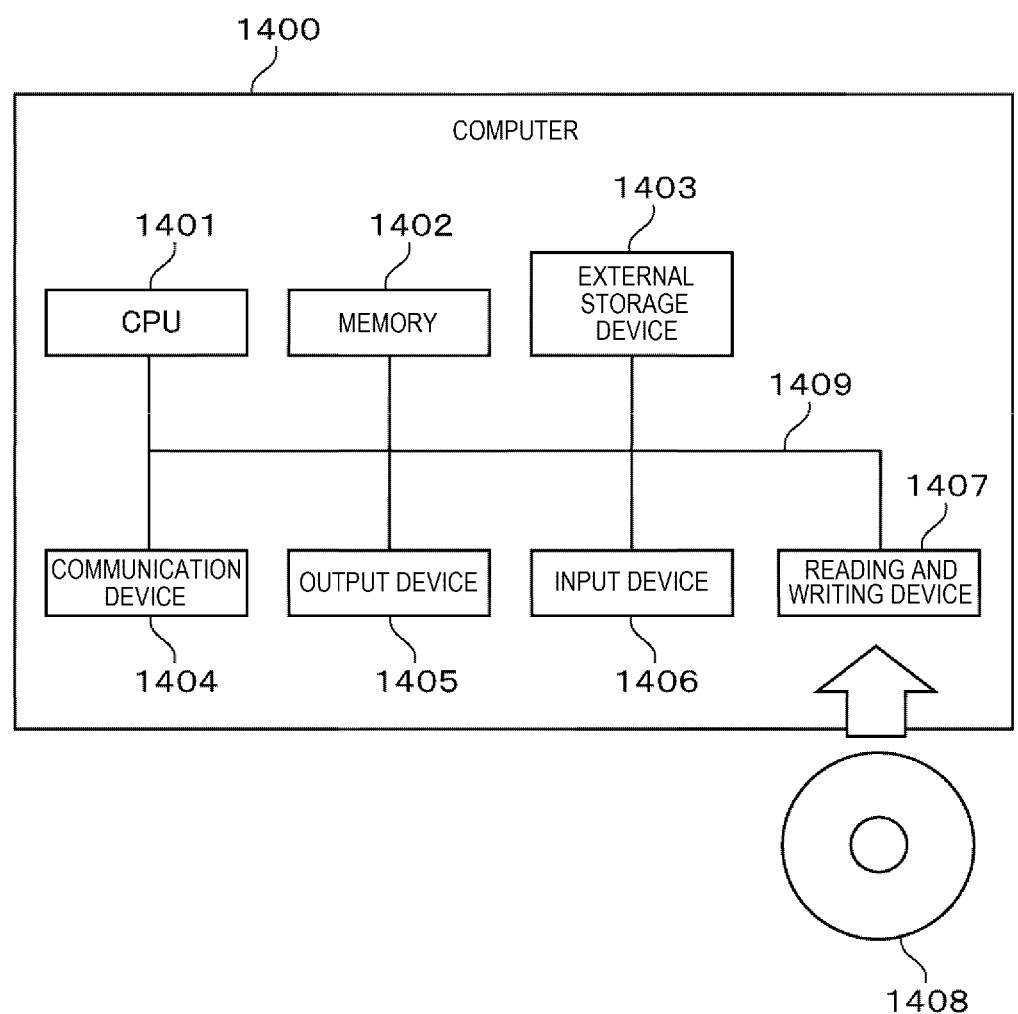

INSPECTION METHOD

TECHNICAL FIELD

The present invention relates to an inspection method.

BACKGROUND ART

A charged particle beam device such as an electron microscope or an ion microscope is used for observation of various samples having a fine structure. For example, for an object of process control in a manufacturing process for a semiconductor device, a scanning electron microscope, which is one of charged particle beam devices, is applied to measurement such as dimensional measurement and defect inspection for a semiconductor device pattern formed on a semiconductor wafer as a sample.

As one of sample analysis methods using an electron microscope, a method is known in which a voltage contrast image is formed based on secondary electrons or the like obtained by irradiating a sample with an electron beam, and the electrical resistance of an element formed on the sample is evaluated based on the analysis of the voltage contrast image.

For example, PTL 1 discloses a method that has a mechanism capable of measuring a current by bringing a probe into contact with a sample, and that is for inspecting a defect based on a change in current when an electron beam and light are emitted or only an electron beam is emitted. PTL 2 discloses a method for inspecting a position and a type of a defect by changing a voltage contrast by irradiating a sample with light.

CITATION LIST

Patent Literature

PTL 1: JP2003-022946A
PTL 2: JP2003-151483A

SUMMARY OF INVENTION

Technical Problem

In inspection and measurement of a semiconductor device, it is required to detect a defect in electrical characteristics of the device in a manufacturing process. In PTL 1, a defect due to a change in resistance can be inspected based on the electron beam and light irradiation conditions, but there is a problem that a defect depending on time response such as capacitance cannot be detected. PTL 2 discloses a method for inspecting the position and type of a defect, but a circuit model serving as a reference is necessary to quantitatively evaluate the defect.

Accordingly, an object of one aspect of the invention is to provide an inspection method capable of measuring electrical characteristics of a device that cannot be measured by a method in the related art.

Solution to Problem

An aspect of the invention provides an inspection method performed by a charged particle beam device that observes a microstructure of a sample to be inspected, which is an observation target, using a charged particle beam, the charged particle beam device including: a charged particle optical system including a charged particle source configured to emit a charged particle beam, an electron pulse generator configured to pulse-control the charged particle beam, and a detector configured to detect secondary electrons generated by irradiating the sample to be inspected with the pulse-controlled charged particle beam, a light irradiation system including a light source configured to irradiate the sample to be inspected with light having a predetermined wavelength, and a gate configured to pulse-control the light having a predetermined wavelength, the light irradiation system including a light source configured to irradiate the sample to be inspected or the analysis sample with light having a predetermined wavelength, and a gate configured to pulse-control the light having a predetermined wavelength, a contact probe configured to detect a characteristic of the sample to be inspected irradiated with the light having a predetermined wavelength pulse-controlled by the gate or the sample to be inspected, a measurement instrument configured to measure the characteristics of the sample to be inspected or the sample to be inspected detected by the contact probe, a control device configured to control the charged particle optical system, the light irradiation system, and the contact probe, and a movable stage on which the sample to be inspected or the analysis sample is placed, the inspection method including: controlling, by the control device, the contact probe in synchronization with the pulse-controlled light having a predetermined wavelength; measuring, by the measurement instrument, a characteristic of the sample to be inspected or the analysis sample; and generating, by an electrical characteristic analysis device, a circuit model based on a value measured by the measurement instrument; and estimating a circuit constant or a defect structure of the sample to be inspected based on the circuit model created by the electric characteristic analysis device and a detection signal of the secondary electrons detected by the charged particle beam device.

Advantageous Effects of Invention

According to an aspect of the invention, it is possible to measure electrical characteristics of a device that cannot be measured by a method in the related art.

BRIEF DESCRIPTION OF DRAWINGS

FIG. 5 is a flowchart showing an example of a circuit constant estimation process showing a processing procedure of a circuit constant estimation method performed by the electrical characteristic analysis device according to the first embodiment.

FIGS. 7A to 7G are diagrams showing an example of connection information included in a netlist.

FIG. 8 is a diagram showing an example of an input and output screen that displays selections of electronic device circuit information, inputs of various types of conditions, and an estimation result of a circuit constant.

FIG. 9 is a diagram showing an example of a use case according to the first embodiment.

FIG. 10 is a schematic diagram showing an example of a configuration of an electrical characteristic analysis device according to a second embodiment.

FIGS. 11A and 11B are diagrams illustrating a processing example of a sample S according to the second embodiment.

FIG. 12 is a diagram showing an example of a use case according to the second embodiment.

FIG. 13 is a schematic diagram showing an example of a configuration of an electrical characteristic analysis device according to a third embodiment.

FIG. 14 is a diagram showing an example of a model extraction method according to the third embodiment.

FIG. 15 is a diagram showing an example of a use case according to the third embodiment.

FIG. 16 is a schematic diagram of a computer showing an example of a computing machine.

DESCRIPTION OF EMBODIMENTS

Figure 1:
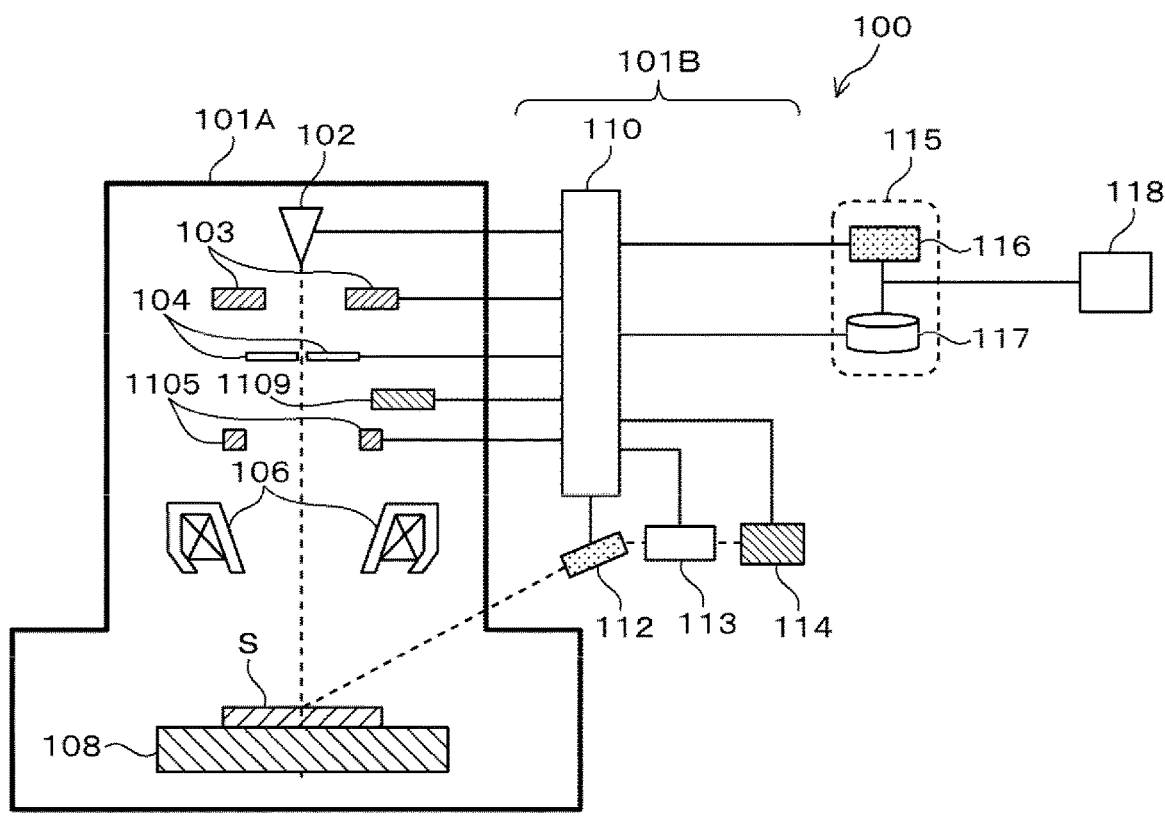
FIG. 1 is a schematic diagram showing an example of a configuration of a charged particle beam device according to a first embodiment.

Hereinafter, embodiments of the invention will be described with reference to the drawings. The following description and drawings are examples for describing the invention, and are omitted and simplified as appropriate for clarification of the description. The invention can be implemented in various other forms. Unless otherwise specified, the number of components may be singular or plural.

In order to facilitate understanding of the invention, a position, a size, a shape, a range, or the like of each component shown in the drawings may not represent an actual position, size, shape, range, or the like. Therefore, the invention is not necessarily limited to the position, size, shape, range, or the like shown in the drawings.

In the following description, although various types of information may be described in terms of expressions such as "table", and "list", the various types of information may be expressed by other data structures. "XX table", "XX list", and the like are referred to as "XX information" to indicate that information does not depend on a data structure. When identification information is described, expressions such as "identification information", "identifier", "name", "ID", and "number" are used, and these expressions may be replaced with one another.

When there are a plurality of elements having a same or similar function, different subscripts may be attached to the same reference sign. However, when there is no need to distinguish the plurality of components, the subscripts may be omitted.

In the following description, a process performed by executing a program may be described. The program is executed by a processor (for example, a central processing unit (CPU) or a graphics processing unit (GPU)) to appropriately perform a predetermined process using a storage resource (for example, a memory) and/or an interface device (for example, a communication port), or the like. Therefore, the processor may serve as a subject of the process. Similarly, the subject of the process performed by executing the program may be a controller, device, system, computing machine, or node including a processor therein. The subject of the process performed by executing the program may be a calculation unit, and may include a dedicated circuit (for example, a field-programmable gate array (FPGA) or an application specific integrated circuit (ASIC)) that performs a specific process.

The program may be installed from a program source into a device such as the computing machine. The program source may be, for example, a program distribution server or a computing machine-readable storage medium. When the program source is a program distribution server, the program distribution server may include a processor and a storage resource that stores a program to be distributed, and the processor of the program distribution server may distribute the program to be distributed to another computing machine. In the following description, two or more programs may be implemented as one program, or one program may be implemented as two or more programs.

Hereinafter, a case will be described in which a "scanning electron microscope (SEM)" is used as an aspect of the charged particle beam device. Alternatively, a microscope other than the SEM may be used, and an example thereof will be described in a second embodiment and subsequent embodiments. In addition, an image obtained by imaging a defect on a semiconductor wafer as an image of an observation target will be described as a target. Alternatively, the target may be an image obtained by imaging a flat panel display or another sample such as a biological sample.

Hereinafter, a device that measures a pattern on a semiconductor wafer will be described as an example of the scanning electron microscope, and the "scanning electron microscope" broadly includes a device that captures an image of a sample using an electron beam. Other examples of the scanning electron microscope include an inspection device that uses a scanning electron microscope, a review device, a general-purpose scanning electron microscope, and a sample processing device or a sample analysis device that include a scanning electron microscope, and the present disclosure can be applied to these devices. In the embodiment described below, the scanning electron microscope also includes a system in which the scanning electron microscope is connected via a network or a composite device in which a plurality of scanning electron microscopes are combined.

In the embodiments described below, the semiconductor wafer on which the pattern is formed will be described as an example of the "sample", but the invention is not limited thereto. Alternatively, the "sample" may be a metal, a ceramic, a biological sample or the like.

In the embodiments described below, measurement of electrical characteristics of the pattern on the semiconductor wafer will be described as an example of "measurement" in the scanning electron microscope that measures the pattern on the semiconductor wafer, but the invention is not limited thereto. Alternatively, the "measurement" may be observation or inspection of the pattern.

First Embodiment

FIG. 1 is a schematic diagram showing an example of a configuration of a charged particle beam device according to the present embodiment. A charged particle beam device 100 according to a first embodiment includes an SEM main body 101A that images a sample and an SEM control device group 101B. The SEM control device group 101B is connected to a computing machine 115. FIG. 1 illustrates a system configuration in which the SEM main body 101A and the SEM control device group 101B are electrically connected to the computing machine 115, but the SEM main body 101A, the SEM control device group 101B, and the computing machine 115 may be implemented as one device.

The SEM main body 101A includes an electron gun 102 serving as a charged particle source, an electron pulse generator 103 that generates an electron pulse from laser light emitted from a light source 114, a condenser lens 104 serving as a diaphragm of a primary electron beam (irradiation electron beam) generated by the electron gun 102, a deflector 105 that aligns a position where the primary electron beam is incident on an objective lens 106, the objective lens 106, a stage (sample holder) 108 on which a sample (wafer) is placed, and a secondary electron detector 109 that detects secondary electrons obtained from a sample S by irradiating the sample S with the primary electron beam. The stage 108 may be a movable stage that can be moved by a predetermined operation mechanism such as a motor.

The primary electron beam is focused on the sample S by the condenser lens 104 and the objective lens 106, and the sample S is irradiated with the primary electron beam. The deflector 105 aligns a position where the primary electron beam is incident on the objective lens 106. The sample S is scanned with the primary electron beam by a deflector (not shown). Secondary electrons obtained from the sample S by the irradiation with the primary electron beam are directed toward a direction of the secondary electron detector 109 by an E×B filter (not shown), and are detected by the secondary electron detector 109. Next, the SEM control device group 101B will be described.

As shown in FIG. 1, the SEM control device group 101B includes a control device 110 that controls each unit of the SEM main body 101A and each unit of the SEM control device group 101B, an optical path lens 112 such as a splitter that deflects the laser light emitted from the light source 114, a gate 113 that controls whether to block the laser light, and the light source 114 that emits laser light having a predetermined wavelength to the sample S. A signal detected by the secondary electron detector 109 is sent to the control device 110 and imaged. The control device 110 includes an image generation unit that generates an image based on a signal output from the secondary electron detector 109, and a device control unit that controls a voltage source for applying a voltage to various types of lenses, deflectors, electrodes, detectors, a circuit board, and the like, a current source for supplying a current, and the like (not shown). As described above, the device control unit and the image generation unit may be implemented as hardware by a dedicated circuit board, or may be implemented by software executed by a computer connected to the charged particle beam device 100. When the device control unit and the image generation unit are implemented by the hardware, the device control unit and the image generation unit can be implemented by integrating a plurality of calculators that execute processes on a wiring board, a semiconductor chip, or a package. When the device control unit and the image generation unit are implemented by the software, the device control unit and the image generation unit can be implemented by mounting a high-speed general-purpose CPU on the computer and executing a program for executing desired calculation processes. Next, the computing machine 115 will be described.

The computing machine 115 is implemented by a general computer as the hardware. The computing machine 115 includes a calculator 116 that performs control of the SEM main body 101A via the SEM control device group 101B and processes based on various instructions for the control, and a storage device 117 that stores various types of data used for the control and the processes. The computing machine 115 is electrically connected to an input and output device 118 for inputting and displaying various types of information for performing the above-described control and processes, or outputting and displaying various types of information indicating results of performing the above-described control and processes. Although not particularly described with reference to FIG. 1, the computing machine 115 includes input devices such as a keyboard and a mouse.

As shown in FIG. 16 (schematic diagram of the computer), the computing machine 115 can be implemented by a general computer 200 including, for example, a CPU 1401, a memory 1402, an external storage device 1403 such as a hard disk drive (HDD), a reading and writing device 1407 that reads and writes information from and to a portable storage medium 1408 such as a compact disk (CD) or a digital versatile disk (DVD), an input device 1406 such as a keyboard or a mouse, an output device 1405 such as a display, a communication device 1404 such as a network interface card (NIC) for connecting to a communication network, and an internal communication line (referred to as a system bus) 1409 such as a system bus that connects these devices.

For example, a database or a table stored in the computing machine 115 can be implemented by the CPU 1401 reading the database or the table from the memory 1402 or the external storage device 1403 and using the database or the table. A circuit map model generation unit 211, a circuit simulation (circuit simulation unit) 214, a comparison unit 216, a circuit constant estimation and calculation unit 217, and a device-internal circuit model generation unit 2121 (all of which will be described later) that are provided in the computing machine 115 can be implemented by the CPU 1401 loading a predetermined program stored in the external storage device 1403 into the memory 1402 and executing the program. In the computing machine 115, the CPU 1401 may control the input device 1406 to implement an input function of the input and output device 118. In the computing machine 115, the CPU 1401 may control the output device 1405 to implement an output function of the input and output device 118. In addition, the computing machine 115 may include a communication unit capable of implementing a communication function by the CPU 1401 controlling the communication device 1404.

The predetermined program described above may be stored (downloaded) in the external storage device 1403 from the storage medium 1408 via the reading and writing device 1407 or from a network via the communication device 1404 and then loaded into the memory 1402, and executed by the CPU 1401. The program may also be loaded directly into the memory 1402 from the storage medium 1408 via the reading and writing device 1407 or from the network via the communication device 1404, and executed by the CPU 1401.

Figure 2:
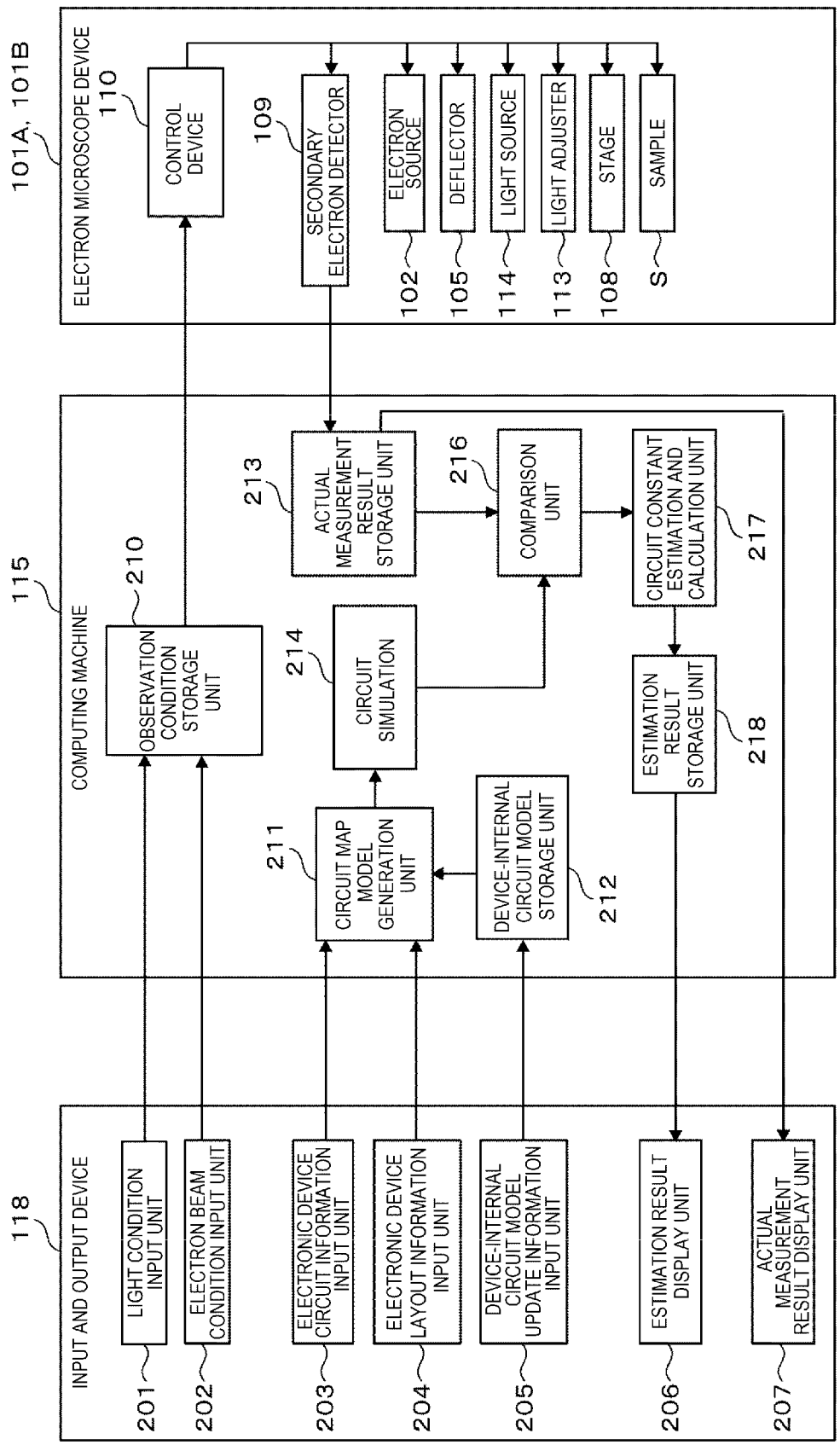
FIG. 2 is a block diagram showing an example of a functional configuration of the charged particle beam device shown in FIG. 1.

FIG. 2 is a block diagram showing an example of a functional configuration of the charged particle beam device shown in FIG. 1. The units constituting the SEM main body 101A and the SEM control device group 101B are denoted by the same reference signs as those in FIG. 1, and the description thereof is omitted. As shown in FIG. 2, the input and output device 118 functionally includes a light condition input unit 201 that receives an input of conditions such as an intensity, wavelength, and period of the laser light emitted from the light source 114, an electron beam condition input unit 202 that receives an input of conditions such as an acceleration voltage and magnification of the primary electron beam generated by the electron gun 102, an electronic device circuit information input unit 203 that receives an input of electronic device circuit information constituting the sample S such as coordinates, a netlist, and a correspondence table of the sample S as the observation target, and an electronic device layout information input unit 204 that receives an input of layout information of the sample S and device information such as DRAM and SRAM. For example, when the DRAM is input, layout information of the DRAM prepared in the device is applied to the sample S. Further, the input and output device 118 includes the device-internal circuit model update information input unit 205 that receives a circuit model stored in advance in the device from an information medium such as a server (for example, a model data server 840), an estimation result display unit 206 that displays an estimated value (for example, an estimated value of a circuit constant) of an optical response characteristic of the sample S, and an actual measurement result display unit 207 that displays an actual measurement value (for example, an imaging result of the sample S) of the optical response characteristic of the sample S. An example of information input and output by the input and output device 118 will be described later with reference to FIG. 8.

The computing machine 115 functionally includes an observation condition storage unit 210 that stores information received from the light condition input unit 201 and the electron beam condition input unit 202 of the input and output device 118, a device-internal circuit model storage unit 212 that stores the received device-internal circuit model update information, a circuit map model generation unit 211 that generates a circuit map model of the sample S based on the received electronic device circuit information and electronic device layout information, and the information in the device-internal circuit model storage unit, the circuit simulation 214 that simulates electrical characteristics of the circuit map model of the circuit map model generation unit 211, an actual measurement result storage unit 213 that stores a signal detected by the secondary electron detector, a comparator (comparison unit) 216 that compares a result of the circuit simulation with the above measurement result stored in the actual measurement result storage unit 213 and determines whether the result of the circuit simulation and the measurement result match each other, a circuit constant estimation and calculation unit 217 that estimates a circuit constant when it is determined that the simulation result and the actual measurement result match each other, and an estimation result storage unit 218 that stores an estimation result obtained by the circuit constant estimation and calculation unit 217. As hardware of each storage unit provided in the computing machine, for example, the memory or the external storage device described above can be used.

Figure 3:
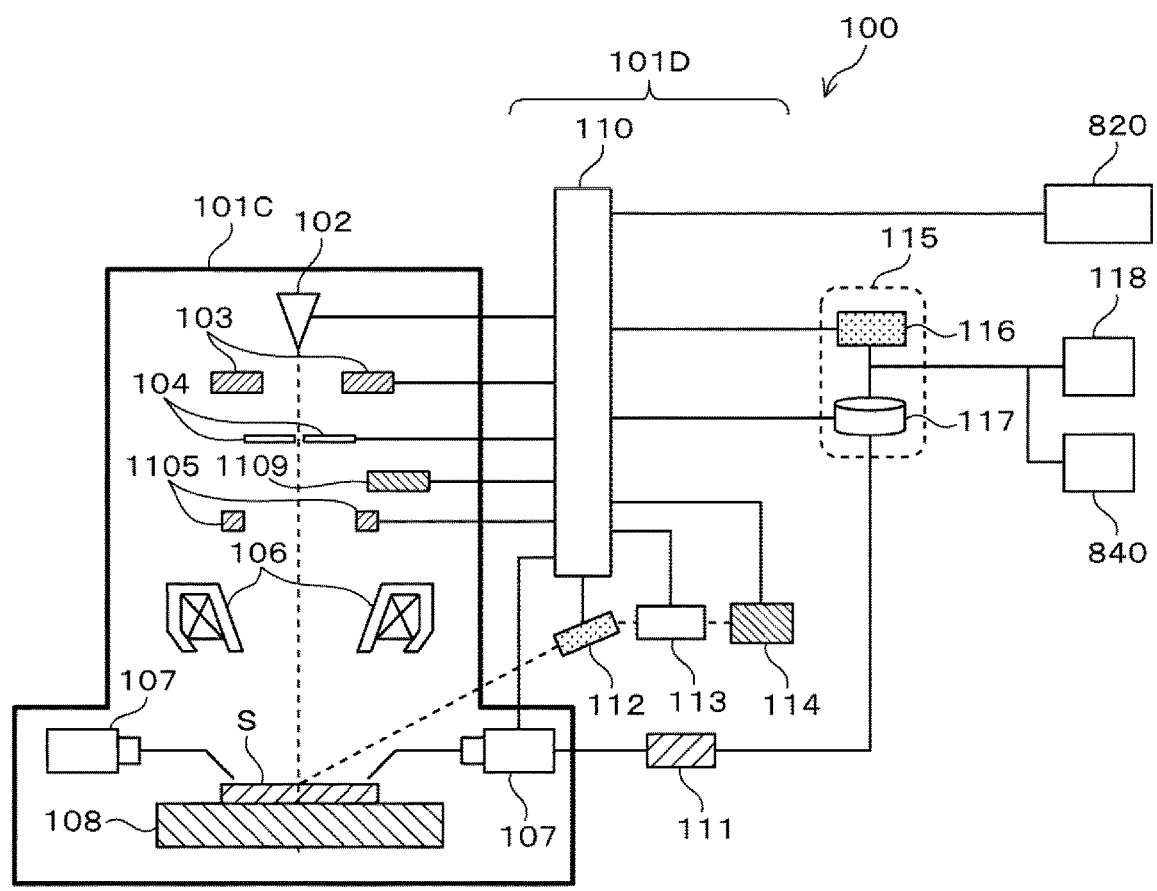
FIG. 3 is a schematic diagram showing an example of a configuration of an electrical characteristic analysis device according to the first embodiment.

FIG. 3 is a schematic diagram showing an example of an electrical characteristic analysis device 900 according to the first embodiment. The electrical characteristic analysis device 900 according to the first embodiment includes an SEM main body 101C that images a sample and an SEM control device group 101D. The SEM control device group 101C is connected to a computing machine 1151. FIG. 3 illustrates a system configuration in which the SEM main body 101C and the SEM control device group 101D are electrically connected to the computing machine 1151. Alternatively, the SEM main body 101C, the SEM control device group 101D, and the computing machine 1151 may be implemented as one device.

The SEM main body 101C has the same configuration as that of the SEM main body 101A shown in FIG. 1, and further includes a fine contact probe 107 that observes characteristics such as properties and a shape of the sample by tracing the sample (wafer) S and that outputs a detection signal thereof (for example, a detection signal of a current flowing through the sample, a magnetic force, or a surface voltage). Since a basic operation of each component is the same as that in FIG. 1, here the same reference signs are denoted and the description thereof will be omitted. Next, the SEM control device group 101D will be described.

As shown in FIG. 3, the SEM control device group 101D includes an electrical current and voltage meter 111 that is a measurement instrument for measuring a current and a voltage of a probe of the control device 110. The control device 110 controls each unit of the SEM main body 101C and each unit of the SEM control device group 101D. Since a basic operation of each component other than these components is the same as that in FIG. 1, the description thereof is omitted here.

Further, the electrical characteristic analysis device 900 may be connected to a wafer data server 820 that accumulates an observation image of the sample S obtained by the SEM main body 101C and various types of information (position coordinates of the sample S, probe conditions, and the like) related to the observation image as in a case in FIG. 10 described later, and these pieces of information may be read as necessary. In addition, the electrical characteristic analysis device 900 may be connected to a model data server 840 that performs probing measurement according to coordinate information or the like read from the wafer data server 820 and that accumulates the extracted circuit model. In order to quantitatively evaluate a defect, the model data server 840 may accumulate various types of circuit models including the circuit map model, and may read these pieces of information as necessary.

Figure 4:
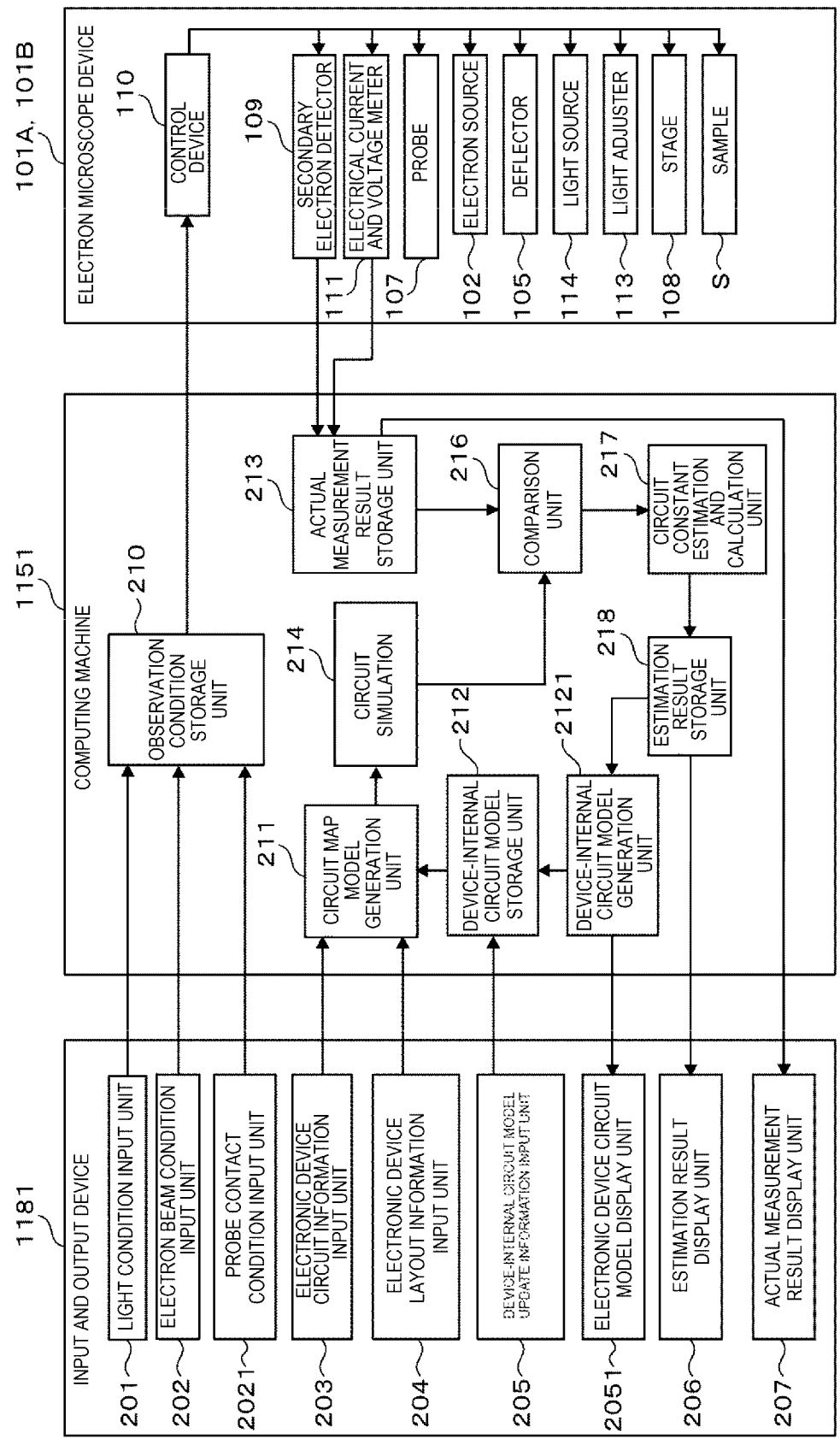
FIG. 4 is a block diagram showing an example of a functional configuration of the electrical characteristic analysis device shown in FIG. 3.

FIG. 4 is a block diagram showing an example of a functional configuration of the electrical characteristic analysis device 900 shown in FIG. 3. The units constituting the SEM main body 101C and the SEM control device group 101D are denoted by the same reference signs as those in FIG. 3, and the description thereof is omitted. As shown in FIG. 4, the input and output device 1181 functionally includes a probe contact condition input unit 2021 that receives an input of conditions such as position coordinates, an applied voltage, and a measurement mode (a mode indicating any one of current measurement and voltage measurement) of the probe in addition to the light condition input unit 201 and the electron beam condition input unit 202 shown in FIG. 2, and the electronic device layout information input unit 204 that receives the input of the layout information of the sample S and the device information such as DRAM and SRAM in addition to the electronic device circuit information input unit 203 shown in FIG. 2. In addition to the device-internal circuit model update information 205 shown in FIG. 2, the input and output device 1181 includes an electronic device circuit model display unit 2051 that displays a state of the sample S including a defect portion obtained based on a circuit model for obtaining an absolute value of a circuit based on an actual measurement value, the estimation result display unit 206 shown in FIG. 2, and the actual measurement result display unit 207.

The computing machine 1151 functionally includes the device-internal circuit model storage unit 212 that stores the received device-internal circuit model update information, the circuit map model generation unit 211 that generates the circuit map model of the sample S based on the received electronic device circuit information and electronic device layout information, and the information in the device-internal circuit model storage unit 212, the observation condition storage unit 210 that stores information received from the light condition input unit 201 of the input and output device, the electron beam condition input unit 202, and the probe contact condition input unit 203, the actual measurement result storage unit 213 that stores signals detected by the secondary electron detector and values measured by the electrical current and voltage meter, the observation condition storage unit 210 that stores the information received from the circuit map model generation unit 211, the circuit simulation 214 that simulates the electrical characteristics of the circuit map model generated by the circuit map model generation unit 211, the comparator 216 that compares the result of the circuit simulation with the above measurement result stored in the actual measurement result storage unit 213 and determines whether the result of the circuit simulation and the measurement result match each other, the circuit constant estimation and calculation unit 217 that estimates the circuit constant when it is determined that the simulation result and the actual measurement result match each other, and the estimation result storage unit 218 that stores the estimation result obtained by the circuit constant estimation and calculation unit 217. As hardware of each storage unit provided in the computing machine, for example, the memory or the external storage device described above can be used. The device-internal circuit model generation unit 2121 will be described with reference to a flowchart of FIG. 5.

FIG. 5 is a flowchart showing an example of a circuit constant estimation process showing a processing procedure of a circuit constant estimation method performed by the electrical characteristic analysis device according to the present embodiment. As shown in FIG. 5, first, a control unit (for example, the CPU 1401) of the computing machine receives, from the input and output device 1181, information received from the light condition input unit 201, the electron beam condition input unit 202, and the probe contact condition input unit 203 (S301), and stores the information in the observation condition storage unit 210 as the observation conditions (S302).

Subsequently, the control device 110 controls the electron gun 102, the deflector 105, the light source 114, the optical path lens 112, the probe 107, and the like according to the above received conditions stored in the observation condition storage unit 210 (S303), and captures an image of the sample S (S304). Accordingly, a user observes the sample S.

The control device 110 outputs the signal obtained from the secondary electron detector 109 and the value obtained from the voltage and electrical current meter to the computing machine 1151, and the control unit (for example, the CPU 1401) of the computing machine 1151 stores these pieces of information in the actual measurement result storage unit 213 as actual measurement results (S305).

Then, the control unit (for example, the CPU 1401) of the computing machine 1151 determines whether the observation of the sample S under all the observation conditions is completed (S306), and when it is determined that the observation of the sample S under all the observation conditions (for example, a plurality of conditions specified by the user or a plurality of predetermined conditions) is completed (S306: Yes), the device-internal circuit model generation unit 2121 generates a circuit model based on the received electronic device circuit information 203 and electronic device layout information 204, and the device-internal circuit model update information input unit 205, and simulates the electrical characteristics of the circuit model. The device-internal circuit model generation unit 2121 compares the simulation result with the actual measurement result to check consistency of the model (S307).

On the other hand, when the control unit (for example, the CPU 1401) of the computing machine 1151 determines that the observation of the sample S under all the observation conditions is not completed (S306: No), the process returns to S303 and the subsequent processes are repeated until the observation of the sample S under all the observation conditions is completed.

For example, in the comparison between the simulation result and the actual measurement result, when the consistency thereof is higher than a received threshold value, the circuit map model generation unit 211 displays a circuit constant of the circuit model as an estimation result. On the other hand, in the comparison between the simulation result and the actual measurement result, when the consistency thereof is lower than the received threshold value, the circuit map model generation unit 211 compares the actual measurement result with a separately prepared circuit simulation result, and repeats the comparison until the consistency becomes higher than the threshold value.

Figure 6A:
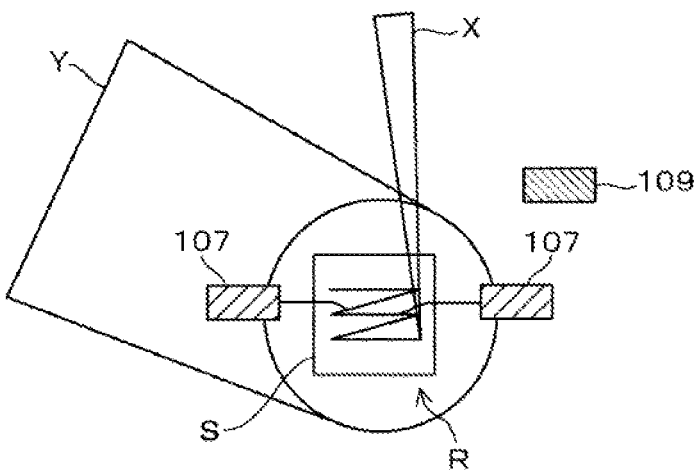
FIGS. 6A to 6D are diagrams illustrating an example of light conditions received from a light condition input unit and electron beam conditions received from an electron beam condition input unit among observation conditions.
Figures 6B, 6C, 6D:
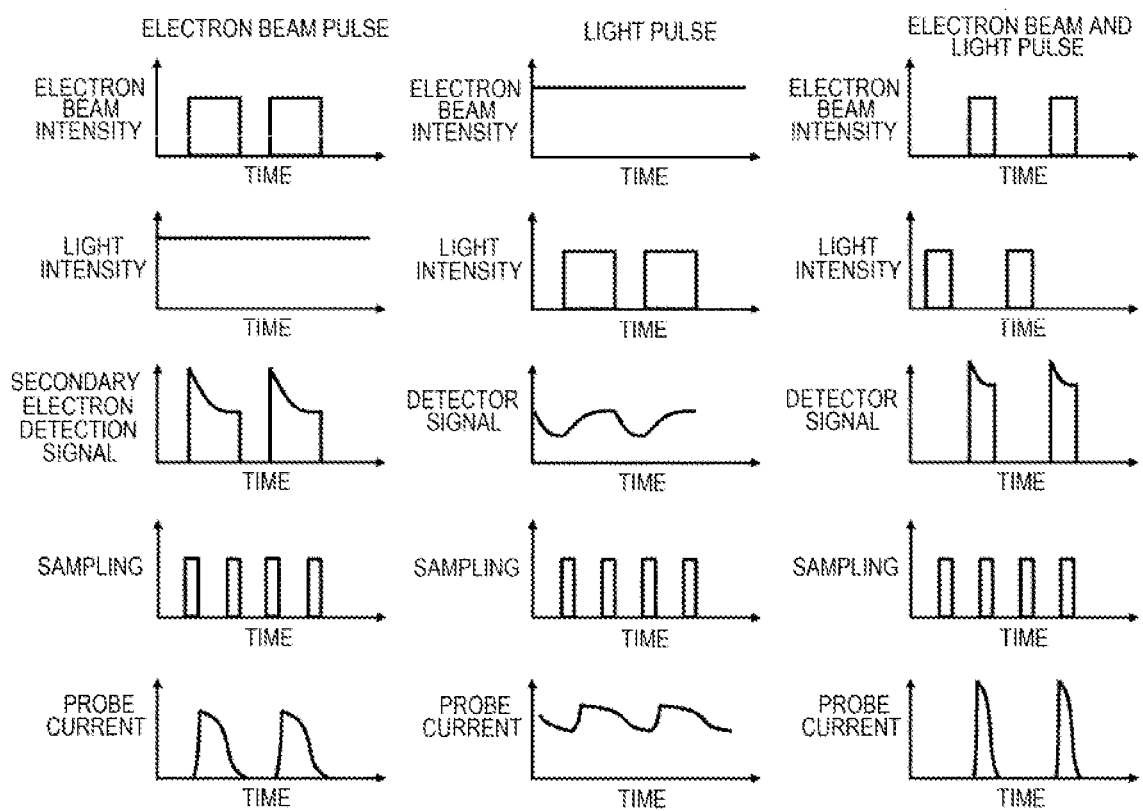

FIGS. 6A to 6D are diagrams illustrating an example of light conditions received from the light condition input unit 201 and electron beam conditions received from the electron beam condition input unit 202 among the observation conditions of the electrical characteristic analysis device. FIG. 6A shows a state in which the sample S is observed under the light conditions and the electron beam conditions. The control device 110 pulse-controls laser light Y emitted based on the light conditions in which the intensity, the wavelength, and the like are determined, and a primary electron beam X emitted based on the electron beam conditions in which the acceleration voltage, the magnification, and the like are determined. The secondary electron detector 109 and the probe 107 sample the sample S placed in an observation region R in synchronization with the pulse-controlled laser light Y and primary electron beam X. FIG. 6B shows an example of waveforms (A) of a secondary electron detection signal and a probe current obtained when the primary electron beam X is pulse-controlled and the intensity of the laser light Y is constant, waveforms (B) of a secondary electron detection signal and a probe current obtained when the intensity of the primary electron beam X is constant and the laser light Y is pulse-controlled, and waveforms (C) of a secondary electron detection signal and a probe current obtained when the primary electron beam X and the laser light Y are pulse-controlled. As shown in these graphs, when both the primary electron beam X and the laser light Y are pulse-controlled, the waveforms of the secondary electron detection signal and the probe current can be obtained in a shorter time, and thus a position and type of the defect can be inspected in a shorter time.

Subsequently, referring back to FIG. 5, when the device-internal circuit model generation unit 2121 generates the circuit model, the device-internal circuit model generation unit 2121 generates the netlist of the sample S using the electronic device circuit information such as the position coordinates of the sample S input by the user, connection information included in the netlist, the correspondence table thereof, and the observation condition stored in S302 based on the information indicating a configuration of the circuit map model output to the input and output device 118 together with the above information. Further, the circuit simulation 214 generates an equivalent circuit of the netlist for the sample S, and executes simulation of the generated equivalent circuit (S308).

FIGS. 7A to 7G are diagrams showing an example of the connection information included in the netlist. FIGS. 7A to 7G are registered in the list. The circuit map model generation unit 211 generates the netlist for the sample S by reading and combining these components and the connection information. Then, the circuit simulation 214 generates an equivalent circuit based on the generated netlist, and executes the simulation.

The comparison unit 216 compares the simulation result obtained by the circuit simulation 214 with the above actual measurement result stored in the actual measurement result storage unit 213 (S309), and determines whether the simulation result and the actual measurement result match each other (S310). When the comparison unit 216 determines that the simulation result and the actual measurement result do not match each other (S310: No), the process returns to S308, and the generation of the netlist and the simulation of the equivalent circuit are continued until the simulation result and the actual measurement result match each other.

On the other hand, when it is determined that the above simulation result and actual measurement result match each other (S310: Yes), the circuit constant estimation and calculation unit 217 estimates the circuit constant of the equivalent circuit as the circuit constant of the sample S (S311), stores the estimation result in the estimation result storage unit 218, and the control unit (for example, the CPU 1401) of the computing machine 115 displays the actual measurement result stored in S305 and the estimation result on the actual measurement result display unit 207 and the estimation result display unit 206 of the input and output device 118, respectively (S312).

FIG. 8 is a diagram showing an example of an input and output screen that displays selections of the electronic device circuit information, inputs of various types of conditions, and the circuit constant and an estimation result of a circuit state. As shown in FIG. 8, an input and output screen 600 is provided with the electronic device circuit information input unit 204 including a selection field 601 for selecting a coordinate file, a selection field 602 for selecting a netlist file, and a selection field 603 for selecting a correspondence table file.

The selection field 601 receives a selection of a coordinate file in which the position coordinates of the sample S are defined. The user reads, from the coordinate file, the position coordinates of the sample S in the circuit map model received from a folder of the computer or the computing machine 1151 stored in advance. Alternatively, new position coordinates can be set by changing the position coordinates defined in the read coordinate file.

The selection field 602 receives a selection of the netlist file including a netlist. The user reads, from the netlist file, the netlist of the sample S in the circuit map model received from the folder of the computer or the computing machine 1151 stored in advance. Alternatively, a new netlist or component can be set by changing the netlist or component defined in the read netlist file.

The selection field 603 receives a selection of a correspondence table file in which the netlist and the position coordinates of the sample S are associated with each other. The user reads, from the coordinate file, the netlist of the sample S, the correspondence table of the position coordinates of the sample S, and the like in the circuit map model received from the folder of the computer or the computing machine 1151 stored in advance. Alternatively, a new correspondence table can be set by changing the correspondence table defined in the read correspondence table file.

The input and output screen 600 further includes the electron beam condition input unit 202 including an input field 604 for inputting an electron beam condition, the light condition input unit 201 including an input field 605 for inputting a light condition, and the probe beam condition input unit 203 including an input field 606 for inputting a probe condition. Values are input to these input fields according to an observation environment when the user observes the sample S. In FIG. 8, for example, 800 V is input as the acceleration voltage in the input field 604, 10 mV is input as the intensity of the laser light in the input field 605, and 50 mV is input as the applied voltage in the input field 606.

The input and output screen 600 further includes an image display unit 607 that displays an SEM image when the sample S is observed under the conditions selected or input in the selection fields 601 to 603 and the input fields 604 to 606. FIG. 8 shows that the sample S is placed at a position of position coordinates P145.

The input and output screen 600 includes the estimation result display unit 206 and the actual measurement result display unit 207 including an optical response display unit 608 that displays, for example, an optical response comparison graph in which the actual measurement result and the estimation result of the circuit constant are represented on one graph for the optical response characteristics of the sample S at the position coordinates indicated by the image display unit 607. In FIG. 8, it can be seen that an actual measurement graph R indicating the actual measurement result and an estimation graph P indicating the estimation result are displayed on one display unit and compared with each other.

The input and output screen 600 further includes an estimation result display unit 206 including a circuit state display unit 609 that displays the circuit state obtained as the estimation result. In FIG. 8, as a result of the circuit state estimation process shown in FIG. 5, it is displayed that there is a defect in the diode disposed between N021 and N022.

FIG. 9 is a diagram showing an example of a use case according to the present embodiment. As shown in FIG. 9, in a semiconductor manufacturing process, in an in-line environment, a measurement and defect inspection of a pattern formed on a substrate in a plurality of manufacturing processes P1 to P3 are performed using charged particle beam devices 703 and 704 and a wafer tester 705 that are provided corresponding to the respective processes. After the measurement and defect inspection, only those satisfying certain criteria are sent to a dicing and packaging device 706 and shipped as products.

In the in-line environment, information of the device-internal circuit model update information input unit 205 and recipe information are received from a data server 701 that manages the manufacture of the semiconductor, and the inspection is performed in each process according to these pieces of information. Then, the inspection result in each process is fed back to the data server 701 as inspection information. In particular, the wafer tester 705 outputs wafer inspection data to the data server 701 together with the semiconductor devices manufactured in the previous process in a pretreatment process 707 for removing a wiring and the like constructed in a latter manufacturing process in an upper layer of a layer of the sample S.

In the pretreatment process 707, a pretreatment device (for example, a computer similar to the computing machine 1151) that performs pretreatment outputs data after the wiring and the like are removed to the electrical characteristic analysis device 100, and after the circuit state estimation process shown in FIG. 5 is performed and the defect inspection is performed in the electrical characteristic analysis device 100, an inspection result is fed back to any one of the manufacturing processes as the information of the device-internal circuit model update information input unit 205 or the recipe via the data server 710. In addition, in each manufacturing process, a part of the semiconductor device for which the inspection is completed by the charged particle beam devices 703 and 704 is transported to the electrical characteristic analysis device 100.

The data accumulated in the data server 701 is read into a computing server 702 as graphic data system (GDS) data, process information, and wafer inspection data. The computing server 702 may substitute for the computing machine 1151 constituting the electrical characteristic analysis device 100. The computing server 702 outputs coordinate information indicating the position coordinates of the sample S to the data server 701, and the coordinate information can also be used for in-line inspection.

As described above, in the present embodiment, the electrical characteristic analysis device 800 that observes a microstructure of a sample (for example, the sample S) as an observation target using a charged particle beam includes a charged particle optical system including a charged particle source (for example, the electron gun 102) configured to emit a charged particle beam to the above sample, an electron pulse generator (for example, the electron pulse generator 103) configured to pulse-control the charged particle beam, and a detector (for example, the secondary electron detector 109) configured to detect secondary electrons generated by irradiating the sample with the pulse-controlled charged particle beam, a light irradiation system including a light source (for example, the light source 114) configured to irradiate the sample with light having a predetermined wavelength, and a gate (for example, the gate 113) configured to pulse-control the light having a predetermined wavelength, a contact probe (for example, the fine contact probe 107) configured to detect a characteristic of the sample irradiated with the charged particle beam pulse-controlled by the electron pulse generator and the light having a predetermined wavelength pulse-controlled by the gate, a measurement instrument (for example, the electrical current and voltage meter 111) configured to measure the characteristic of the sample detected by the contact probe, a control device (for example, the control device 110) configured to control the charged particle optical system, the light irradiation system, and the contact probe. The control device controls the contact probe in synchronization with the pulse-controlled charged particle beam and light having a predetermined wavelength and measures the characteristic of the sample with the measurement instrument, and thus, it is possible to measure electrical characteristics of a device that cannot be measured by a method in the related art.

Second Embodiment

In the first embodiment, the electrical characteristic analysis device using the SEM is described, but the invention can also be applied to a case in which a microscope other than the SEM is used. Hereinafter, an electrical characteristic analysis device using an optical microscope instead of the SEM will be described.

When the sample is processed by the charged particle beam, an operator processes the sample while observing a processing position of the sample and an irradiation position of the charged particle beam. Therefore, it is necessary to acquire an image of the processing position of the sample during the processing as in the first embodiment. In general, a secondary electron image obtained by a secondary electron detector is used. Alternatively, in the secondary electron image obtained by the secondary electron detector, when a broad charged particle beam is emitted, it may be difficult to identify a position at which the processing or deposition film formation is performed.

Therefore, in the following, the processing position and the irradiation position of the charged particle beam can be identified by the optical microscope. For example, the irradiation position of the charged particle beam can be checked by checking a processing mark formed by the charged particle beam irradiation with an optical microscope. In addition, mechanical or electrical adjustment may be performed in advance such that the irradiation position of the charged particle beam and an observation position of the optical microscope coincide with each other. Accordingly, the processing position of the charged particle beam can be determined based on an image of the optical microscope. In addition, a relationship between the irradiation position of the charged particle beam and the observation position of the optical microscope may be recorded in advance. Accordingly, the processing position of the charged particle beam can be determined based on the image of the optical microscope.

FIG. 10 is a schematic diagram showing an example of a configuration of an electrical characteristic analysis device according to the present embodiment. The electrical characteristic analysis device according to the second embodiment includes an optical microscope 801A and a microscope control device group 801B. The microscope control device group 801B is connected to a computing machine 815. FIG. 10 illustrates a system configuration in which the optical microscope 801A and the microscope control device group 801B are electrically connected to the computing machine 815. Alternatively, as in the case according to the first embodiment, the optical microscope 801A, the microscope control device group 801B, and the computing machine 815 may be implemented as one device.

The optical microscope 801A includes an optical microscope main body 802, and a probe 807 and a stage 808 similar to those according to the first embodiment. Although a specific configuration of the optical microscope main body 802 is not particularly shown, an optical microscope (for example, an optical microscope having a confocal optical system) generally known in the related art can be used as a device using a charged particle beam. Hereinafter, it is assumed that the optical microscope main body 802 is disposed along an optical axis of the charged particle source, but a position of the optical microscope main body 802 and a position of the optical axis are not limited as long as the irradiation position on the sample with the charged particle source can be observed. For example, an optical axis of the optical microscope main body 802 may be inclined with respect to the optical axis of the charged particle source. Next, the microscope control device group 801B will be described.

As shown in FIG. 10, the microscope control device group 801B includes a control device 810 that controls each unit of the optical microscope 801A and each unit of the microscope control device group 801B, an electrical current and voltage meter 811 that is a measurement instrument for measuring a current and a voltage of the probe 807, an optical path lens 812 such as a splitter that deflects the laser light emitted from a light source 814, a gate 813 that controls whether to block the laser light, and the light source 814 that emits laser light having a predetermined wavelength to the sample S.

An image signal on which an image of a confocal microscope is formed by scanning with the laser light in the optical microscope main body 802 is sent to the control device 110 and imaged. The control device 810 includes an image generation unit that generates an image based on an image signal output from the optical microscope main body 802, and a device control unit that controls a voltage source for applying a voltage to various types of lenses, deflectors, electrodes, detectors, a circuit board, and the like, a current source for supplying a current to these devices, and the like (not shown). The device control unit may be implemented by various types of hardware or various types of software as in the case according to the first embodiment. Next, the computing machine 815 will be described.

The computing machine 815 is implemented by a general computer as the hardware as in the case according to the first embodiment. The computing machine 815 includes a calculator 816 that performs control of the optical microscope 801A via the microscope control device group 801B and processes based on various instructions for the control, and a storage device 817 that stores various types of data used for the control and the processes. The control device 810 is electrically connected to the input and output device 118 that inputs and displays various types of information for performing the above-described control and processes, or outputs and displays various types of information indicating results of performing the above-described control and processes. FIG. 10 illustrates a case in which the input and output device 818 is connected to the control device 810. Alternatively, as in the case according to the first embodiment, the input and output device 818 may be connected to the computing machine 815.

Further, the electrical characteristic analysis device 800 is connected to a wafer data server 820 that accumulates an observation image of the sample S obtained by the optical microscope 801A and various types of information (position coordinates of the sample S, light conditions 605 and probe conditions 606 shown in FIG. 6, and the like) related to the observation image, and these pieces of information are read as necessary. In addition, the electrical characteristic analysis device 800 is connected to a model data server 840 that performs probing measurement according to coordinate information or the like read from the wafer data server 820 and that accumulates the extracted circuit model. In order to quantitatively evaluate a defect, the model data server 840 may accumulate various types of circuit models including the circuit map model, and may read these pieces of information as necessary.

FIGS. 11A and 11B are diagrams illustrating a processing example of a sample S according to the second embodiment. In the electrical characteristic analysis device 800 according to the second embodiment, in order to observe the sample S with the naked eye using the optical microscope, a plurality of electrodes of the sample S are collected into one region, and the region is regarded as one electrode and set as a measurement target. FIG. 11A shows an example in which a chip 901 disposed at a certain coordinate position of the sample S is divided into a plurality of regions R. FIG. 11A shows that a process condition (for example, a dose amount or the like) is defined for each coordinate area near the certain coordinate position, and the chip 901 disposed at position coordinates corresponding to the coordinate area is provided at a position having five regions R.

FIG. 11B shows a procedure in which a plurality of electrodes formed in one region among the plurality of regions R shown in FIG. 11A are set as one measurement target. Specifically, a top view and a cross-sectional view of the chip 901 in the region R before the coating electrode is applied (before treatment) and after the coating electrode is applied (after treatment) are shown. In the state before the treatment, a plurality of electrodes E and diffusion layers D (nine in FIG. 11B) in the region R are disposed at position coordinates separated from each other and are independent from each other, but in the state after the treatment, it is understood that the plurality of electrodes E and the diffusion layers D in the region R are formed as one pseudo electrode as a coating electrode E'.

As described above, in the electrical characteristic analysis device 800, the coating process is performed for each coordinate area on a model creation wafer in which the process condition is changed for each coordinate area of the sample S, and an electrical characteristic at the time of light irradiation for each coordinate area is measured by the probe. Then, the actual measurement value of the optical response characteristic of the sample in which the coating electrode is generated for each coordinate area is stored in the storage device 817 (for example, a storage unit same as the actual measurement result storage unit 213 according to the first embodiment) of the computing machine 815, and the same processes as the processes in S307 and thereafter in FIG. 5, such as the generation of the circuit map model, the generation of the netlist, and the simulation of the equivalent circuit, are performed for the sample in which the coating electrode is generated.

FIG. 12 is a diagram showing an example of a use case according to the present embodiment. In the use case shown in FIG. 12, as in the case according to the first embodiment, in the in-line environment, a measurement and defect inspection of a pattern formed on a substrate in a plurality of manufacturing processes P11 to P13 are performed using charged particle beam devices 803 and 804 and a wafer tester 805 that are provided corresponding to the respective processes, and only those satisfying certain criteria are sent to a dicing and packaging device 806 and shipped as products.

As in the case according to the first embodiment, in the in-line environment, the information of the device-internal circuit model update information input unit 205 and recipe information are received from a data server 1001 that manages the manufacture of the semiconductor, the inspection is performed in each process according to these pieces of information, and the inspection result in each step is fed back to the data server 701 as the inspection information. In particular, in the present embodiment, in the wafer tester 805, a pretreatment process 1208 (pretreatment process 2) for performing the processing shown in FIG. 11 is performed in addition to a pretreatment process 1207 (pretreatment process 1) similar to the case according to the first embodiment. The pretreatment process 1208 is performed after the in-line charged particle beam devices 803 and 804, and a part of the semiconductor device after being subjected to the inspection in each manufacturing process is transported to the electrical characteristic analysis device 800.

In the wafer tester 805, the circuit state estimation process shown in the drawing is performed in the charged particle beam device 800 through the pretreatment process 1207 similar to the case according to the first embodiment, the defect inspection is performed, and then the inspection result is fed back to, via the data server 1001, any one of the manufacturing processes as the device-internal circuit model update information or the recipe. In addition, in each manufacturing process, data related to the inspection results in the charged particle beam devices 803 and 804 is output to the electrical characteristic analysis device 800. The data accumulated in the data server 1001 is read into a computing server 1002 as GDS data, process information, and wafer inspection data. The computing server 1002 may substitute for the computing machine 815 constituting the charged particle beam device 800. The computing server 1002 outputs coordinate information indicating the position coordinates of the sample S to the data server 1001, and the coordinate information can also be used for in-line inspection.

As described above, in the present embodiment, the electrical characteristic analysis device 800 that observes a microstructure of a sample as an observation target using a charged particle beam includes a charged particle optical system including a charged particle source (for example, an electron gun same as the electron gun 102) configured to emit a charged particle beam to the above sample, and an electron pulse generator (for example, an electron pulse generator same as the electron pulse generator 103) configured to pulse-control the charged particle beam, a light irradiation system including a light source (for example, the light source 814) configured to irradiate the sample with light having a predetermined wavelength, and a gate (for example, the gate 813) configured to pulse-control the light having a predetermined wavelength, a contact probe (for example, the probe 807) configured to detect a characteristic of the sample irradiated with the charged particle beam pulse-controlled by the electron pulse generator and the light having a predetermined wavelength pulse-controlled by the gate, a measurement instrument (for example, the electrical current and voltage meter 811) configured to measure the characteristic of the sample detected by the contact probe, and a control device (for example, the control device 810) configured to control the charged particle optical system, the light irradiation system, and the contact probe. The control device controls the contact probe in synchronization with the pulse-controlled charged particle beam and the light having a predetermined wavelength and measures the characteristics of the sample with the measurement instrument using the coating electrode E' coated with the plurality of electrodes E in a predetermined region (for example, region R) in which the process condition of the sample is determined for each coordinate area of the sample, and thus, the electrical characteristics of the device that cannot be measured by the method in the related art can be measured by a method different from that according to the first embodiment.

Third Embodiment

In the first embodiment, in the electrical characteristic analysis device using the SEM, the fine contact probe that observes the characteristics such as the characteristics and the shape of the sample by tracing the sample (wafer) S and that outputs the detection signal is used. Alternatively, a non-contact probe may be used. Hereinafter, an electrical characteristic analysis device using a non-contact probe in an electrical characteristic analysis device using the SEM will be described.

FIG. 13 is a schematic diagram showing an example of a configuration of an electrical characteristic analysis device according to the present embodiment. An electrical characteristic analysis device 1100 according to a third embodiment includes an SEM main body 1101A that images a sample and an SEM control device group 1101B. The SEM control device group 1101B is connected to a computing machine 1115 as in the case according to the first embodiment. FIG. 13 illustrates a system configuration in which the SEM main body 1101A and the SEM control device group 1101B are electrically connected to the computing machine 1115. Alternatively, as in the case according to the first embodiment, the SEM main body 1101A, the SEM control device group 1101B, and the computing machine 1115 may be implemented as one device.

As in the case according to the first embodiment, the SEM main body 1101A includes an electron gun 1102, an electron pulse generator 1103, a condenser lens 1104, a deflector 1105, and an objective lens 1106, and further includes a non-contact probe 1107 that observes characteristics such as a property and a shape of the sample (wafer) S in a non-contact state in which a probe is separated by a certain distance and that outputs a detection signal (for example, a detection signal of a current flowing through the sample, a magnetic force, and a surface voltage), a stage 1108 on which the sample is placed, and a secondary electron detector 1109 that detects secondary electrons obtained from the sample S by irradiating the sample S with a primary electron beam. Next, the SEM control device group 1101B will be described.

As shown in FIG. 13, as in the case according to the first embodiment, the SEM control device group 1101B includes the control device 110 that controls each unit of the SEM main body 1101A and each unit of the SEM control device group 1101B, an optical path lens 1112, the gate 113, and the light source 114, and further includes an electrical current meter 1111A that is a measurement instrument for measuring a current flowing through the probe 1107 and the stage 1108 on which the sample S is placed, and a surface electrometer 1111B that is a measurement instrument for measuring a surface voltage of the sample S. Next, the computing machine 1115 will be described.

The computing machine 1115 is implemented by a general computer as the hardware. As in the case according to the first embodiment, the computing machine 1115 includes a calculator 1116 that performs control of the SEM main body 1101A via the SEM control device group 1101B and processes based on various instructions for the control, and a storage device 1117 that stores various types of data used for the control and the processes. As in the case according to the first embodiment, the computing machine 1115 is electrically connected to an input and output device 1118, and includes input devices such as a keyboard and a mouse.

The electrical characteristic analysis device 1100 is connected to a model data server 1140 that performs probing measurement in a non-contact manner and that accumulates the extracted circuit model. As in the case according to the second embodiment, the model data server 1140 may accumulate various types of circuit models including the circuit map model, and may read these pieces of information as necessary.

FIG. 14 is a diagram showing an example of a model extraction method according to the third embodiment. As shown in FIG. 14, in the present embodiment, after the electron gun 1102 irradiates the sample S with the electron beam X to generate the charge of the sample S, the sample S is moved under the probe 1107. Thereafter, a change in the surface voltage of the sample S when the laser light Y is emitted from the light source 1114 is measured by the surface electrometer 1111B, and a current flowing through the probe 1107 and the stage 1108 on which the sample S is placed is measured by the electrical current meter 1111A. An equivalent circuit model is created based on the measured surface voltage and the current flowing through the sample S. The equivalent circuit model may be generated using a device-internal circuit model generation unit same as the device-internal circuit model generation unit 2121 as in the case according to the first embodiment. The surface electrometer 1111B may be provided with a slit 1201, so that the sample S is irradiated with the laser light.

As described above, in the electrical characteristic analysis device 1100, after the sample S is charged by irradiating the sample S with the electron beam, the electrical characteristic at the time of light irradiation such as the surface voltage and a sample current of the sample is measured by irradiating the sample S with the laser light, the actual measurement value of the optical response characteristic of the sample is stored in the storage device 1117 (for example, a storage unit same as the actual measurement result storage unit 213 according to the first embodiment) of the computing machine 1115, and the same processes as the processes in S307 and thereafter in FIG. 3, such as the generation of the circuit map model, the generation of the netlist, and the simulation of the equivalent circuit, are performed for the sample.

FIG. 15 is a diagram showing an example of a use case according to the present embodiment. In FIG. 15, as in the case according to the first embodiment, in the in-line environment, a measurement and defect inspection of a pattern formed on a substrate in a plurality of manufacturing processes P1 to P3 are performed using charged particle beam devices 1303 and 1304 and a wafer tester 1305 that are provided corresponding to the respective processes, and only those satisfying certain criteria are sent to a dicing and packaging device 1306 and shipped as products. As in the case according to the first embodiment, in the in-line environment, the information of the device-internal circuit model update information input unit 205 and recipe information are received from a data server 1301, the inspection is performed in each process according to these pieces of information, and the inspection result is fed back to the data server 1301 as the inspection information.

In particular, in the present embodiment, in the wafer tester 1305, the pretreatment process 1307 as in the case according to the first embodiment is performed, the circuit state estimation process shown in FIG. 3 is performed in the electrical characteristic analysis device 1100 through the pretreatment process 1307, the defect inspection is performed, and then the inspection result is fed back to, via the data server 710, any one of the manufacturing processes as the device-internal circuit model update information or the recipe. In addition, in each manufacturing process, a part of the semiconductor device after being subjected to the inspection by the charged particle beam devices 1303 and 1304 is transported to the electrical characteristic analysis device 1100. The data accumulated in the data server 1301 is read into a computing server 1302 as GDS data, process information, and wafer inspection data. The computing server 1302 may substitute for the computing machine 118 constituting the electrical characteristic analysis device 1100. The computing server 1302 outputs coordinate information indicating the position coordinates of the sample S to the data server 1301, and the coordinate information can also be used for in-line inspection.

As described above, in the present embodiment, the electrical characteristic analysis device 1100 that observes a microstructure of a sample (for example, the sample S) as an observation target using a charged particle beam includes a charged particle optical system including a charged particle source (for example, the electron gun 1102) configured to emit a charged particle beam to the above sample, an electron pulse generator (for example, the electron pulse generator 1103) configured to pulse-control the charged particle beam, and a detector (for example, the secondary electron detector 1109) configured to detect secondary electrons generated by irradiating the sample with the pulse-controlled charged particle beam, a light irradiation system including a light source (for example, the light source 1114) configured to irradiate the sample with light having a predetermined wavelength, and a gate (for example, the gate 1113) configured to pulse-control the light having a predetermined wavelength, a non-contact probe (for example, the non-contact probe 1107) configured to detect a characteristic of the sample irradiated with the charged particle beam pulse-controlled by the electron pulse generator and the light having a predetermined wavelength pulse-controlled by the gate, a measurement instrument (for example, the electrical current meter 1111A and the surface electrometer 1111B) configured to measure the characteristic of the sample detected by the non-contact probe, and a control device (for example, the control device 1110) configured to control the charged particle optical system, the light irradiation system, and the non-contact probe. The measurement instrument includes the electrical current meter 1111A configured to measure a current flowing through the non-contact probe and the surface electrometer 1111B configured to measure a surface voltage of the sample. The control device controls the non-contact probe in synchronization with the pulse-controlled charged particle beam and light having a predetermined wavelength, generates the charge of the sample by irradiating the sample with the charged particle beam as the characteristic of the sample, then measures the change in the surface voltage of the sample when the sample is irradiated with the light having a predetermined wavelength with the surface electrometer, and measures the current flowing through the non-contact probe with the electrical current meter. Therefore, it is possible to measure electrical characteristics of a device that cannot be measured by a method in the related art by a method different from those according to the first embodiment and the second embodiment.

The invention can also be understood as an inspection method for inspecting a sample to be inspected and an analysis sample having the same structure as that of the sample to be inspected using a charged particle beam device and an electrical characteristic analysis device including a contact probe.

For example, in the first embodiment, an inspection method performed by a charged particle beam device that observes a microstructure of a sample to be inspected (for example, the sample S), which is an observation target, using a charged particle beam, the charged particle beam device including: a charged particle optical system including a charged particle source (for example, the electron gun 102) configured to emit a charged particle beam, an electron pulse generator (for example, the electron pulse generator 103) configured to pulse-control the charged particle beam, and a detector (for example, the secondary electron detector 109) configured to detect secondary electrons generated by irradiating the sample to be inspected with the pulse-controlled charged particle beam, a light irradiation system including a light source (for example, the light source 114) configured to irradiate the sample to be inspected with light having a predetermined wavelength, a light source (for example, the light source 114) configured to irradiate the sample to be inspected or the analysis sample with light having a predetermined wavelength, and a gate (for example, the gate 113) configured to pulse-control the light having a predetermined wavelength, a contact probe (for example, the fine contact probe 107) configured to detect a characteristic of the sample to be inspected irradiated with the light having a predetermined wavelength pulse-controlled by the gate or the sample to be inspected, a measurement instrument (for example, the electrical current and voltage meter 111) configured to measure the characteristics of the sample to be inspected or the sample to be inspected detected by the contact probe, a control device (for example, the control device 110) configured to control the charged particle optical system, the light irradiation system, and the contact probe, and a movable stage (for example, the stage 108) on which the sample to be inspected or the analysis sample is placed. The control device controls the contact probe in synchronization with the light having a predetermined wavelength, the measurement instrument measures a characteristic of the sample to be inspected or the analysis sample, and in a system including the electrical characteristic analysis device (for example, the electrical characteristic analysis device 900) that generates a circuit model based on a value measured by the measurement instrument, and it is also understood as an inspection method for estimating a circuit constant or a defect structure of the sample to be inspected by comparing the circuit model created by the electric characteristic analysis device and a detection signal of the secondary electrons detected by the charged particle beam device.

Further, in the above inspection method, the contact probe of the electrical characteristic analysis device may automatically operate up to received measurement coordinates, and automatically measure an electrical characteristic of the sample to be inspected. For example, the control device 110 may automatically operate the probe 107 to measurement coordinates serving as a predetermined target position according to a condition received from the probe contact condition input unit 203 or another predetermined condition.

Further, in the inspection method, the electrical characteristic analysis device may include a charged particle optical system including a charged particle source (for example, the electron gun 102) configured to emit a charged particle beam, an electron pulse generator (for example, the electron pulse generator 103) configured to pulse-control the charged particle beam, and a detector (for example, the secondary electron detector 109) configured to detect secondary electrons generated by irradiating the sample to be inspected with the pulse-controlled charged particle beam.

Further, in the inspection method, the electrical characteristic analysis device (for example, the electrical characteristic analysis device 800) includes a light irradiation system including a light source (for example, the light source 814) configured to irradiate the sample to be inspected or the analysis sample with light having a predetermined wavelength and a gate (for example, the gate 813) configured to pulse-control the light having a predetermined wavelength, a contact probe (for example, the fine contact probe 107) configured to detect a characteristic of the sample to be inspected or the analysis sample irradiated with the light having a predetermined wavelength pulse-controlled by the gate, a measurement instrument (for example, the electrical current and voltage meter 111) configured to measure the characteristic of the sample to be inspected or the analysis sample detected by the contact probe, and an optical microscope (for example, the optical microscope 801A) configured to observe the sample to be inspected or the analysis sample and the contact probe, and a circuit constant or a defect structure of the sample to be inspected may be estimated by a control device (for example, the control device 810) configured to control the light irradiation system, the contact probe and the optical microscope.

Further, the inspection method in the system including the optical microscope may include, for example, a step of coating a predetermined region of the analysis sample with an electrode as shown in FIG. 11.

Further, in the inspection method, the electrical characteristic analysis device (for example, the electrical characteristic analysis device 1100) includes a charged particle optical system including a charged particle source (for example, the electron gun 1102) configured to emit a charged particle beam, an electron pulse generator (for example, the electron pulse generator 1103) configured to pulse-control the charged particle beam, and a detector (for example, the secondary electron detector 1109) configured to detect secondary electrons generated by irradiating the sample to be inspected with the pulse-controlled charged particle beam, a light irradiation system including a light source (for example, the light source 1114) configured to irradiate the sample to be inspected or the analysis sample with light having a predetermined wavelength and a gate (for example, the gate 1113) configured to pulse-control the light having a predetermined wavelength, a non-contact probe (for example, the non-contact probe 1107) configured to detect a characteristic of the sample to be inspected irradiated with a charged particle beam pulse-controlled by the electron pulse generator and the light having a predetermined wavelength pulse-controlled by the gate or the sample to be inspected, and a measurement instrument (for example, the electrical current meter 1111A) configured to measure a current flowing through the sample to be inspected or the analysis sample. A circuit constant or a defect structure of the sample to be inspected may be estimated using the electrical characteristic analysis device.

Further, in a system including the measurement instrument (for example, the electrical current meter 1111A and the surface electrometer 1111B), the electrical characteristic analysis device may move the sample to be inspected or the analysis sample charged by the pulse-controlled charged particle beam to a position of the non-contact probe by the movable stage, measure a surface voltage by the non-contact probe in synchronization with the pulse-controlled light, and measure a current flowing through the sample to be inspected or the analysis sample by the electrical current meter.

REFERENCE SIGNS LIST

100: charged particle beam device
800, 900, 1100: electrical characteristic analysis device
101A: SEM main body
101B: SEM control device group
102: electron gun
103: electron pulse generator
104: condenser lens
105: deflector
106: objective lens
107: fine contact probe 107
108: stage (sample holder)
109: secondary electron detector
110: control device
111: electrical current and voltage meter
112: optical path lens
113: gate
114: light source
115, 1151: computing machine
116: calculator 117: storage device
118, 1181: input and output device
201: light condition input unit
202: electron beam condition input unit
2021: probe contact condition input unit
203: electronic device circuit information input unit
204: electronic device layout information input unit
205: device-internal model update information input unit
206: estimation result display unit
207: actual measurement result display unit
210: observation condition storage unit
211: circuit map model generation unit
2121: device-internal circuit model generation unit
212: device-internal circuit model storage unit
213: actual measurement result storage unit
214: circuit simulation
216: comparison unit
217: circuit constant estimation and calculation unit
218: estimation result storage unit

The invention claimed is:

1. An inspection method using a charged particle beam device that observes a microstructure of a sample, which is an observation target,
the charged particle beam device including
a charged particle optical system including a charged particle source configured to emit a charged particle beam, and a detector configured to detect secondary electrons generated by irradiating the sample with the charged particle beam,
a light irradiation system including a light source configured to irradiate the sample with light having a predetermined wavelength, and a gate configured to pulse-control the light having a predetermined wavelength,
a probe configured to apply a voltage or a current to the sample irradiated with the light having a predetermined wavelength pulse-controlled by the gate,
a measurement instrument configured to measure a characteristic of the sample by the applied voltage or the applied current, and
a movable stage on which the sample is placed,
the inspection method comprising:
measuring the characteristic of the sample using output of the measurement instrument while controlling the probe in synchronization with the pulse-controlled light having a predetermined wavelength;
generating a circuit model based on the characteristic of the sample; and
estimating a circuit constant or a defect structure of the sample based on the circuit model and a detection signal relevant to the secondary electrons output by the detector.

2. The inspection method according to claim 1, wherein the characteristic of the sample is an electrical characteristic.

3. The inspection method according to claim 1, wherein the charged particle optical system includes an electron pulse generator configured to pulse-control the charged particle beam.

4. The inspection method according to claim 1, wherein the charged particle beam device further includes an optical microscope configured to observe the probe and the sample,
the inspection method further comprising
estimating the circuit constant or the defect structure based on output of the optical microscope.

5. The inspection method according to claim 4, wherein the sample is an analysis sample of which a predetermined region is coated with an electrode.

6. The inspection method according to claim 1, wherein the probe is a non-contact probe, and
the output of the measurement instrument is a current value flowing from the sample through the movable stage,
the inspection method further comprising:
estimating the circuit constant or the defect structure based on a surface voltage of the sample; and
measuring the surface voltage using the non-contact probe.

7. A device comprising:
a charged particle beam device; and
a computer,
wherein the charged particle beam device comprises:
a charged particle optical system including a charged particle source configured to emit a charged particle beam, and a detector configured to detect secondary electrons generated by irradiating a sample, which is an observation target, with the charged particle beam,
a light irradiation system including a light source configured to irradiate the sample with light having a predetermined wavelength, and a gate configured to pulse-control the light having a predetermined wavelength,
a probe configured to apply a voltage or a current to the sample irradiated with the light having a predetermined wavelength pulse-controlled by the gate,
a measurement instrument configured to measure a characteristic of the sample by the applied voltage or the applied current, and
a movable stage on which the sample is placed, and
wherein the computer:
measures the characteristic of the sample using output of the measurement instrument while controlling the probe in synchronization with the pulse-controlled light having a predetermined wavelength,
generates a circuit model based on the characteristic of the sample, and
estimates a circuit constant or a defect structure of the sample based on the circuit model and a detection signal relevant to the secondary electrons output by the detector.

8. The device according to claim 7, wherein the characteristic of the sample is an electrical characteristic.

9. The device according to claim 7, wherein the charged particle optical system includes an electron pulse generator configured to pulse-control the charged particle beam.

10. The device according to claim 7, wherein the charged particle beam device further includes an optical microscope configured to observe the probe and the sample, and
the circuit constant or the defect structure is estimated based on output of the optical microscope.

11. The device according to claim 10, wherein the sample is an analysis sample of which a predetermined region is coated with an electrode.

12. The device according to claim 7, wherein the probe is a non-contact probe,
the output of the measurement instrument is a current value flowing from the sample through the movable stage, the circuit constant or the defect structure is further estimated based on a surface voltage of the sample, and the surface voltage is measured using the non-contact probe.

* * * * *